US011018671B2

(12) United States Patent
Bai et al.

(10) Patent No.: US 11,018,671 B2
(45) Date of Patent: May 25, 2021

(54) RECONFIGURABLE CIRCUIT AND THE METHOD FOR USING THE SAME

(71) Applicant: NEC Corporation, Tokyo (JP)

(72) Inventors: Xu Bai, Tokyo (JP); Toshitsugu Sakamoto, Tokyo (JP); Yukihide Tsuji, Tokyo (JP); Makoto Miyamura, Tokyo (JP); Ayuka Tada, Tokyo (JP); Ryusuke Nebashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 292 days.

(21) Appl. No.: 16/083,965

(22) PCT Filed: Apr. 6, 2017

(86) PCT No.: PCT/JP2017/014403
§ 371 (c)(1),
(2) Date: Sep. 11, 2018

(87) PCT Pub. No.: WO2017/195509
PCT Pub. Date: Nov. 16, 2017

(65) Prior Publication Data
US 2020/0295764 A1 Sep. 17, 2020

(30) Foreign Application Priority Data

May 13, 2016 (WO) .................. PCT/JP2016/002358

(51) Int. Cl.
*H03K 19/177* (2020.01)
*H03K 19/17736* (2020.01)
(Continued)

(52) U.S. Cl.
CPC ..... *H03K 19/17744* (2013.01); *H03K 19/177* (2013.01); *H03K 19/1737* (2013.01);
(Continued)

(58) Field of Classification Search
CPC ......... H03K 19/1737; H03K 19/17704; H03K 19/17744; H03K 19/17784; H03K 19/17796
See application file for complete search history.

(56) References Cited

U.S. PATENT DOCUMENTS 7,486,111 B2   2/2009   Madurawe
8,674,724 B2   3/2014   Nazarian et al.
(Continued)

FOREIGN PATENT DOCUMENTS

JP   2006-032867 A   2/2006
JP   2012-074118 A   4/2012
(Continued)

OTHER PUBLICATIONS

Japanese Office Action for JP Application No. 2018-548233 dated Oct. 29, 2019 with English Translation.
(Continued)

*Primary Examiner* — Kurtis R Bahr

(57) ABSTRACT

A reconfigurable circuit includes: a first line; a first switch element disposed between the first line and a first power source line of first voltage; a second line; a second switch element disposed between the second line and a second power source line of second voltage which is different from the first voltage; and a resistive switch assembly disposed between the first line and the second line. The resistive switch assembly includes: a first non-volatile resistive switch; and a second non-volatile resistive switch whose first end is coupled to a first end of the first non-volatile resistive switch. The second end of the first non-volatile resistive switch is coupled to the first line, and the second end of the second non-volatile resistive switch is coupled to the second line.

14 Claims, 14 Drawing Sheets

(51) Int. Cl.
  *H03K 19/173*    (2006.01)
  *H03K 19/17704*  (2020.01)
  *H03K 19/17784*  (2020.01)
  *H03K 19/17796*  (2020.01)
(52) U.S. Cl.
  CPC . *H03K 19/17704* (2013.01); *H03K 19/17784* (2013.01); *H03K 19/17796* (2013.01)

(56) References Cited

U.S. PATENT DOCUMENTS

| | | | |
|---|---|---|---|
| 9,318,158 B2* | 4/2016 | Baker, Jr. | G11C 5/06 |
| 2012/0075910 A1* | 3/2012 | Yasuda | G11C 13/0069 |
| | | | 365/148 |
| 2013/0064002 A1 | 3/2013 | Terai | |
| 2013/0082231 A1 | 4/2013 | Tada et al. | |
| 2013/0181180 A1* | 7/2013 | Tada | H01L 45/146 |
| | | | 257/1 |
| 2013/0335116 A1 | 12/2013 | Nakaya | |
| 2013/0343114 A1 | 12/2013 | Carter | |
| 2014/0327470 A1* | 11/2014 | Nazarian | H03K 19/17764 |
| | | | 326/38 |
| 2015/0371705 A1* | 12/2015 | Onkaraiah | G11C 13/0007 |
| | | | 327/208 |
| 2017/0141125 A1 | 5/2017 | Tada | |

FOREIGN PATENT DOCUMENTS

| | | |
|---|---|---|
| JP | 2013-062401 A | 4/2013 |
| JP | 2013-077681 A | 4/2013 |
| JP | 2019-512950 A | 5/2019 |
| JP | 2019-512951 A | 5/2019 |
| WO | 2011/158821 A1 | 12/2011 |
| WO | 2012/117467 A1 | 9/2012 |
| WO | 2013/190742 A1 | 12/2013 |
| WO | 2015/198573 A1 | 12/2015 |

OTHER PUBLICATIONS

Japanese Office Action for JP Application No. 2018-548231 dated Oct. 29, 2019 with English Translation.

Tada, et al., "Improved Off-State Reliability of Nonvolatile Resistive Switch With Low Programming Voltage", IEEE Transactions on Electron Devices, vol. 59, No. 9, Sep. 2012.

Miyamura, et al., "Low-power Programmable-logic Cell Arrays using Nonvolatile Complementary Atom Switch", ISQED 2014, pp. 330-334.

Bai, et al., "Architecture of Reconfigurable-Logic Cell Array with Atom Switch: Cluster Size & Routing Fabrics", FPGA 2015, pp. 269.

International Search Report dated Aug. 9, 2016 in PCT/JP2016/002358.

International Search Report dated Jun. 27, 2017 in PCT/JP2017/014403.

U.S. Office Action for U.S. Appl. No. 16/083,978 dated Feb. 1, 2021.

* cited by examiner

RECONFIGURABLE CIRCUIT AND THE METHOD FOR USING THE SAME

This application is a National Stage Entry of PCT/JP2017/014403 filed on Apr. 6, 2017, which claims priority from International Patent Application PCT/JP2016/002358 filed on May 13, 2016, the contents of all of which are incorporated herein by reference, in their entirety.

TECHNICAL FIELD

The present invention relates to a reconfigurable circuit with non-volatile resistive switches, and the method for using the reconfigurable circuit.

BACKGROUND ART

A typical semiconductor integrated circuit (IC) is constructed by transistors which is built on a semiconductor substrate and upper layer wires which is used to connect the transistors. The patterns of the transistors and the wires are determined in a design stage of the IC. Interconnections between the transistors and the wires cannot be changed after the fabrication of IC. In order to improve flexibility of IC, field-programmable gate arrays (FPGAs) have been proposed and developed. In FPGAs, configuration data including operation and interconnection information is stored in memories, so that different logic operations and interconnections can be realized by configuring the memories after fabrication according to requirements of end users. Interconnections within FPGA can be altered by controlling ON-and-OFF states of switches in a routing multiplexer (MUX) or routing fabrics arranged in the FPGA in accordance with the interconnection information stored in the memories.

The relatively large energy consumption of FPGAs limits integration of commercial FPGAs into IoT (Internet of Things) devices. In most of commercial FPGAs, SRAM (Static Random Access Memory) is used to store the configuration data. Typically, each memory cell of SRAM is composed of six transistors and each modern FPGA chip has more than 10 M (ten-million) memory cells of SRAM. This causes extremely large area overhead, cost, and energy consumption in FPGAs. In this Description, FPGAs which use SRAM as memories storing configuration data are referred to as SRAM-based FPGAs or SRAM FPGAs.

Recently, FPGAs with non-volatile resistive switches (NVRSs) such as Nanobridge® (NB) integrated between the wires upon a transistor layer have been proposed to overcome the problems of SRAM-based FPGAs and achieve small area overhead [NPL 1, NPL 2]. FPGAs with NBs are referred to as NBFPGAs (Nanobridge® field programmable gate arrays). Non-volatility of NBs also contributes to zero standby power consumption. An example of NVRS which can applied to a memory portion of LSI (Large-Scale Integration) is disclosed in [PTL 1]. An example of structure of the NVRS and the method of writing data in the NVRS is disclosed in [PTL 2].

FIG. 1 illustrates a typical configuration of NBFPGA. A large number of cells 101 constitute a cell array of NBFPGA. Each cell 101 includes routing MUX 102 and logic block 103. In this example, logic block 103 includes two look-up tables (LUTs) 104, two D-type flip-flops 105 and two selectors 106. Routing MUX 102 includes a plurality of input and output lines arranged in a lattice manner which are connected to logic block 103 and adjacent cells 101. Data routing switch 107 is arranged at each cross-point or intersection between the input lines and the output lines. Therefore, routing MUX 102 has a crossbar structure. In FIG. 1, enlarged view 110 illustrates four data routing switches 107 or NBs which are arranged at cross-points between input lines IN0, IN1 and output lines OUT0, OUT1. Each data routing switch 107 is composed of two NVRSs S101, S102 serially connected with each other. One NVRS S101 is coupled to the input line and the other NVRS S102 is coupled to the output line. When both NVRSs S101, S102 in one switch 107 of the crossbar are in ON-state or set state in which NVRS has lower resistance, switch 107 electrically connects the input line to the output line. A signal can be transmitted from the input line to the output line. On the other hand, both NVRSs S101, S102 in switch 107 are in OFF-state or reset state in which NVRS has higher resistance, switch 107 does not electrically connect the input line to the output line. No signal can transmit from the input line to the output line. Two NVRSs S101, S102 constituting each switch 107 are used for only data routing in NBFPGA.

CITATION LIST

Patent Literature

PTL 1: WO 2015/198573 A1
PTL 2: JP 2013-77681A
PTL 3: U.S. Pat. No. 7,486,111 B2

Non Patent Literature

NPL 1: Munehiro Tada, et al., Improved OFF-State Reliability of Nonvolatile Resistive Switch with Low Programming Voltage, IEEE TRANSACTIONS ON ELECTRON DEVICES, Vol. 59, No. 9, pp. 2357-2362, September 2012.
NPL 2: Makoto Miyamura, et al., Low-power programmable-logic cell arrays using nonvolatile complementary atom switch, ISQED 2014, pp. 330-334.
NPL 3: Xu Bai et al., Architecture of Reconfigurable-Logic Cell Array with Atom Switch: Cluster Size & Routing Fabrics, FPGA 2015, pp. 269.

SUMMARY OF INVENTION

Technical Problem

In NBFPGA, a NB crossbar requires more than 60% of the total area of the NBFPGA and this somewhat impairs flexibility of NBFPGA. The relatively low flexibility of NBFPGA still limits its wide applications.

An exemplary object of the present invention is to provide a reconfigurable circuit which has flexibility higher than NBFPGA and can function as both an FPGA and a memory.

Another exemplary object of the present invention is to provide a method for using a reconfigurable circuit which can function as both an FPGA and a memory.

Solution to Problem

According to an exemplary aspect of the present invention, a reconfigurable circuit includes: a first line; a first switch element disposed between the first line and a first power source line of first voltage; a second line; a second switch element disposed between the second line and a second power source line of second voltage which is different from the first voltage; and a resistive switch assembly disposed between the first line and the second line, the resistive switch assembly including a first NRVS (non-volatile resistive switch) and a second NVRS whose first end is coupled to a first end of the first NVRS, wherein a second end of the first NVRS is coupled to the first line, and a second end of the second NVRS is coupled to the second line.

According to another exemplary aspect of the present invention, provided is a method for using reconfigurable circuit comprising a first line, a second line, and a resistive switch assembly disposed between the first line and the second line, wherein the resistive switch assembly includes a first NVRS and a second NVRS whose first end is coupled to a first end of the first NVRS, a second end of the first NVRS is coupled to the first line, and a second end of the second NVRS is coupled the second line. The method includes: using the first NVRS and the second NVRS as a data routing switch between the first line and the second line, by selectively making one of a first state in which the first NVRS and the second NVRS are in ON-state, and a second state in which the first NVRS and the second NVRS are in OFF-state; and using the first NVRS and the second NVRS as a memory element, by making one of the first NVRS and the second NVRS the ON-state and the other the OFF-state.

DESCRIPTION OF EMBODIMENT

Exemplary embodiments of the present invention will be next described with reference to the accompanying drawings.

First Exemplary Embodiment

Figure 2A:
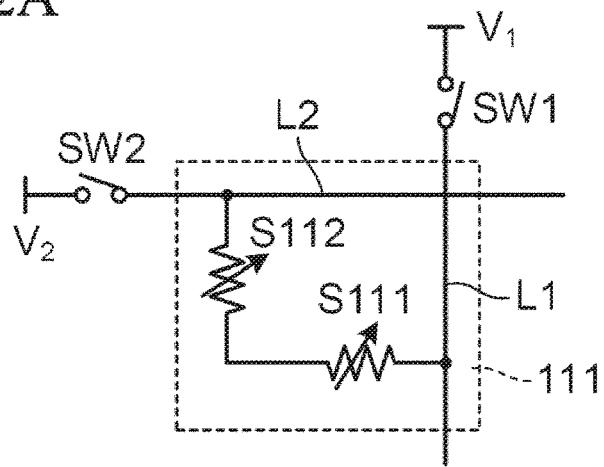
FIGS. 2A and 2B is circuit diagrams illustrating a reconfigurable circuit according to a first exemplary embodiment of the present invention.
Figure 2B:
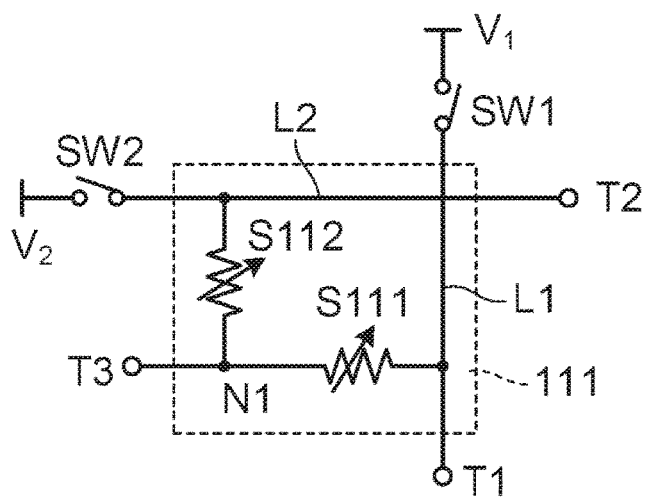

FIG. 2A illustrates a fundamental configuration of a reconfigurable circuit according to a first exemplary embodiment of the present invention. The reconfigurable circuit includes: first line L1; first switch element SW1 disposed between first line L1 and a first power source line of voltage $V_1$; second line L2; second switch element SW2 disposed between second line L2 and a second power source line of voltage $V_2$; and resistive switch assembly 111 disposed between first line L1 and second line L2. The voltages $V_1$ and $V_2$ are different from each other. Resistive switch assembly 111 includes: first NVRS (non-volatile resistive switch) S111; and second NVRS S112 whose first end is coupled to the first end of the first NVRS S111. The second end of first NVRS S111 is coupled to first line L1, and the second end of second NVRS S112 is coupled to second line L2. In order to explain the operation of the reconfigurable circuit of the present exemplary embodiment, we introduce three terminals T1 to T3 to the circuit as shown in FIG. 2B. Terminals T1, T2 are arranged at ends of first line L1 and second line L2, respectively. Terminal T3 is connected to the coupling part or node between first NVRS S111 and second NVRS S112. NVRSs S111, S112 can be separately and arbitrarily programmed to ON-state, i.e., lower resistance state, or OFF-state, i.e., higher resistance state, by applying control voltages among first line L1, second line L2, and the coupling part. Node N1 separated from both NVRSs S111, S112 may be provided as the coupling part of the first end of first NVRS S111 and the first end of second NVRS S112. Alternatively, a portion of one of first NVRS S111 and second NVRS S112 may function as the coupling part.

In one example of the present exemplary embodiment, switch elements SW1, SW2 may be MOS (metal-oxide-semiconductor) transistors, transmission gates, or other controllable devices. Voltages $V_1$, $V_2$ may be power source voltage VDD and ground potential GND, respectively. Alternatively, voltages $V_1$, $V_2$ may be ground potential GND and power source voltage VDD, respectively.

In the reconfigurable circuit shown in FIG. 2A, resistive switch assembly 111 in which two NVRSs S111, S112 are serially connected via the node is disposed between first line L1 and second line L2. Therefore, resistive switch assembly 111 may constitute an one-input-two-output NB (Nanobridge®). The reconfigurable circuit of the present exemplary embodiment uses the NB to implement both a data routing switch and a memory cell. The data routing switch realized by the reconfigurable circuit may be used for path routing in FPGA (field programmable gate array). Here, a mode in which the reconfigure circuit is used as a data routing switch is called data routing mode, and another mode in which the circuit is used as a memory cell is called memory mode.

In the data routing mode, both switch elements SW1, SW2 are turned off. NVRSs S111, S112 are configured to control data routing between terminals T1, T2, i.e., between first line L1 and second line L2. When enabling data routing between terminals T1, T2, both NVRSs S111, S112 are programmed to or made ON-state. When disabling data routing between terminals T1, T2, both NVRSs S111, S112 are made OFF-state. The two serially-connected NVRSs can contribute to low programming voltage and high OFF-state reliability, because voltage stress is divided into half for each NVRS [NPL 1, NPL 2].

In the memory mode, one of NVRSs S111, S112 is made ON-state and the other OFF-state to store data. For example, if NVRS S111 is turned on and NVRS S112 is turned off, data "1" is stored. In read operation, both switch elements SW1, SW2 are turned on to apply voltages $V_1$, $V_2$ to lines L1, L2, respectively. As a result, memory output can be read from terminal T3. If the memory stores "1," the voltage read out from terminal T3 is a value close to voltage $V_1$. When NVRS S111 is turned off and NVRS S112 is turned on, data "0" is stored and a voltage close to $V_2$ may be read out. Voltage stress on either NVRS S111 or S112 is twice larger than that in the data routing mode, however, extremely short read time makes no reliability problem happen.

Figure 3A:
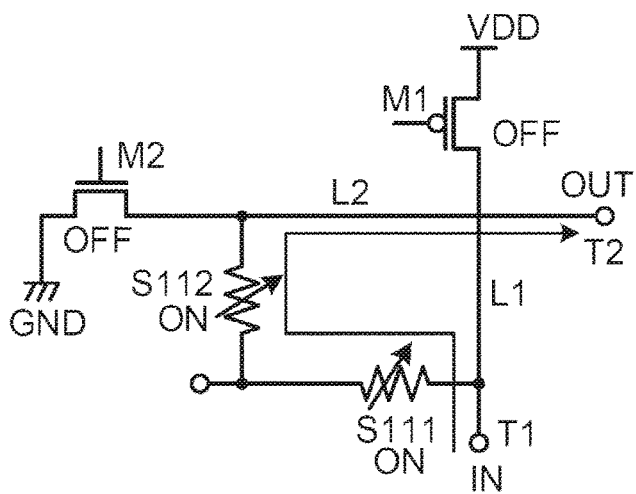
FIGS. 3A to 3D are circuit diagrams illustrating an example of operation of the reconfigurable circuit.
Figure 3B:
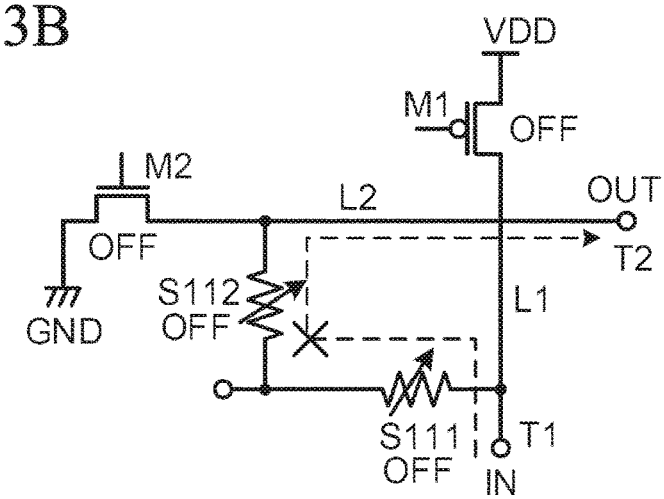
Figure 3C:
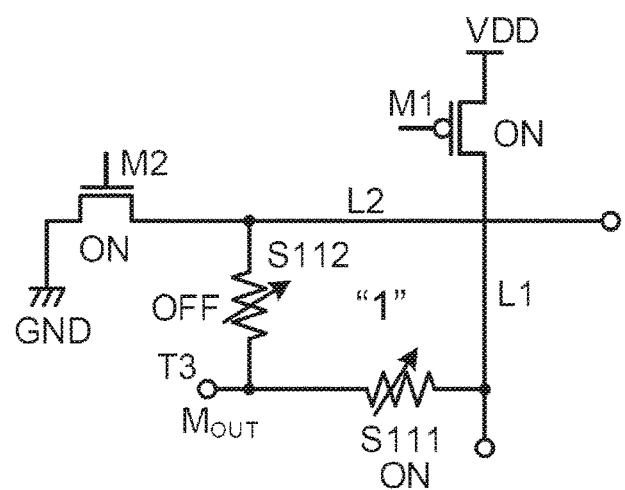
Figure 3D:
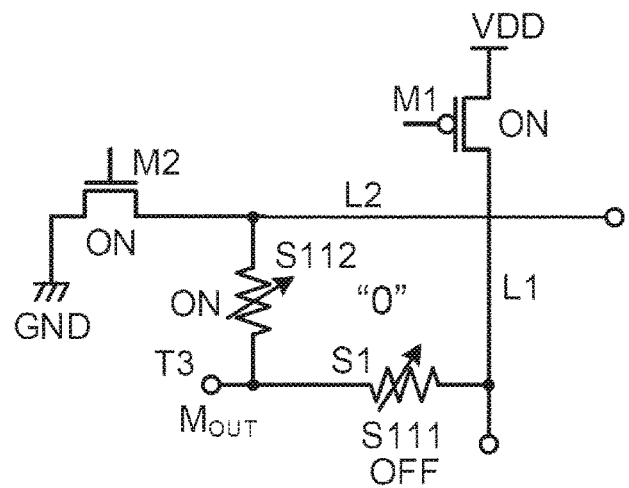

FIGS. 3A to 3D illustrate an example of operation of the reconfigurable circuit of this exemplary embodiment. In FIGS. 3A to 3D, it is assumed that switch elements SW1, SW2 are pMOS transistor M1 and nMOS transistor M2, respectively, and voltages $V_1$, $V_2$ are VDD and GND, respectively. Terminals T1, T2 are input terminal IN and output terminal OUT for data routing, respectively. Terminal T3 is memory output terminal $M_{OUT}$. In the data routing mode, a cutoff voltage and ground potential are applied to the gates of pMOS transistor M1 and nMOS transistor M2 to turn off them. As shown in FIG. 3A, when both NVRSs S111 and S112 are turned on (i.e., in ON-state), a signal can transmit from terminal IN to terminal OUT through NVRSs S111, S112. As shown in FIG. 3B, when both NVRSs S111 and S112 are turned off (i.e., in OFF-state), the path from terminal IN to terminal OFF is cut off. In the memory mode, data "1" is stored by turning on NVRS S111 and turning off NVRS S112, and data "0" is stored by turning off NVRS S111 and turning on NVRS S112. When data is read out, both transistors M1, M2 are turned on. FIG. 3C illustrates reading-out of data "1" in which a voltage close to VDD appears at terminal $M_{OUT}$. FIG. 3D illustrates reading-out of data "0" in which a voltage close to GND appears at terminal $M_{OUT}$.

Figure 4:
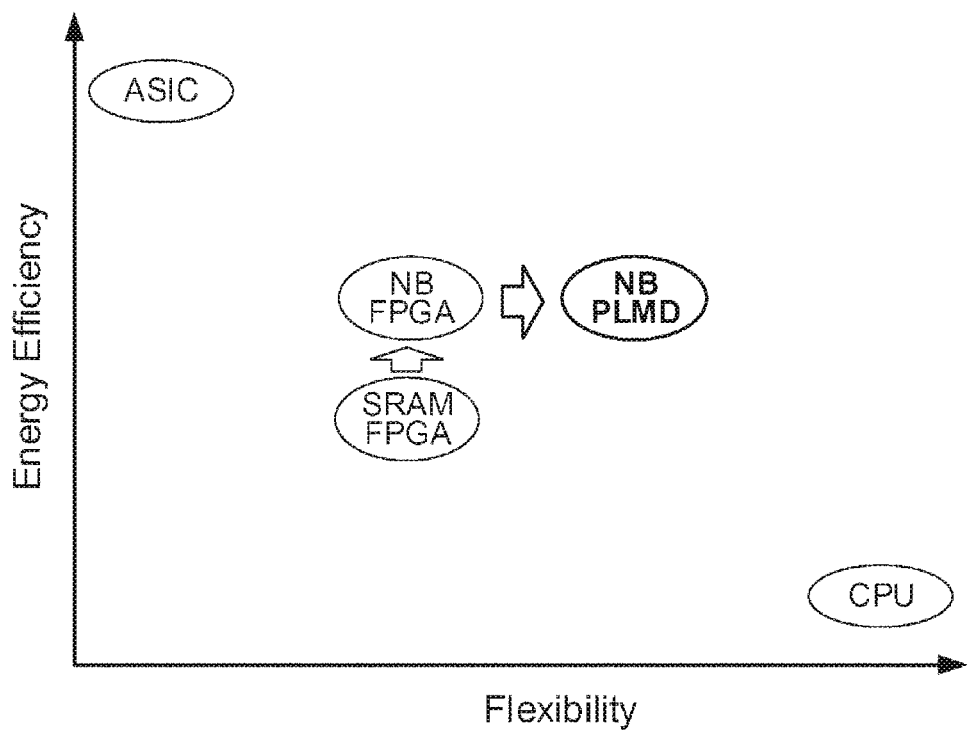
FIG. 4 is a graph showing energy efficiency and flexibility of various semiconductor devices.

As described above, the present exemplary embodiment provides a novel reconfigurable circuit to implement both FPGA and a non-volatile memory using a single device for flexibility improvement. We name the novel reconfigurable circuit NBPLMD (Nanobridge® programmable logic memory device). FIG. 4 illustrates relationship between energy efficiency and flexibility of various semiconductor devices. As shown in FIG. 4, ASIC (Application Specific Integrated Circuit) has high energy efficiency and low flexibility while a CPU (Central Processing Unit) has low energy efficiency and high flexibility. SRAM FPGA has middle energy efficiency and middle flexibility. NBFPGA is an improved version in energy efficiency of SRAM FPGA. Our NBPLMD has flexibility higher than NBFPGA. Therefore, NBPLMD has well-balanced characteristics between energy efficiency and flexibility.

Figure 5:
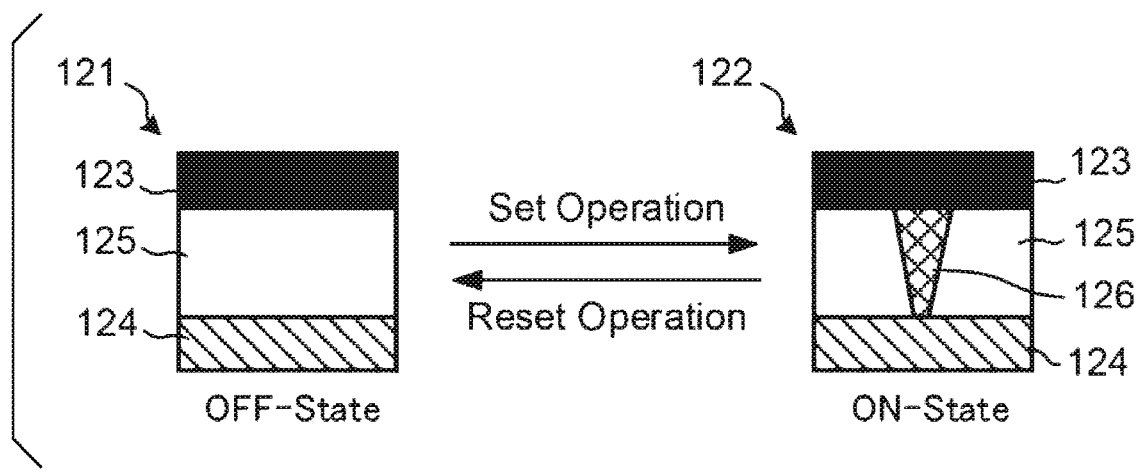
FIG. 5 shows sectional views of an example of a non-volatile resistive element.

Next, NVRS which can be used in the reconfigurable circuit will be described. As described above, NVRS can be altered between ON-state (i.e., set state) and OFF-state (i.e., reset state). In FIG. 5, two NVRSs 121, 122 are illustrated, NVRS 121 is in OFF-state, and NVRS 122 is in ON-state. NVRS includes: active electrode 123 made of, for example, cupper (Cu); inert electrode 124 made of, for example, ruthenium (Ru); and solid-electrolyte 125 sandwiched between active electrode 123 and inert electrode 124.

In the OFF-state, active electrode 123 and inert electrode 124 are electrically separated by solid-electrolyte 125, and the electric resistance between active electrode 123 and inert electrode 124 is very high. When the voltage of inert electrode 124 is fixed to zero and a positive voltage higher than a threshold voltage is applied to active electrode 123 of NVRS 121 in the OFF-state, metal ions are attracted by the electric field and supplied to solid-electrolyte 125. Then, metal bridge 126 is formed between active electrode 123 and inert electrode 124, and both electrode 123, 124 are electrically short-circuited by metal bridge 126. The resistance between active electrode 123 and inert electrode 124 is remarkably reduced. This operation making the NVRS ON-state is referred to set operation. When the voltage of inert electrode 124 is fixed to zero and a negative voltage whose absolute value is larger than another threshold voltage is applied to active electrode 123 of NVRS 122 in the ON-state, metal ions in metal bridge 126 move in a direction of active electrode 123, and metal bridge 126 then disappears. The resistance between active electrode 123 and inert electrode 124 increases and returns the initial value, i.e., the value at the OFF-state. This operation making the NVRS OFF-state is referred to reset operation. NVRS has high ON/OFF resistance ratio (typically, $>10^5$) between the ON- and OFF-states. Small area overhead and high logic density can be achieved by replacing CMOS (Complementary MOS) switch with NVRS.

Two NVRSs are serially connected to constitute resistive switch assembly 111 in the present exemplary embodiment. Since each NVRS has active electrode 123 and inert electrode 124, there are four ways to serially connect two NVRSs. In order to improve reliability of the NVRSs, especially in the data routing mode, it preferable to connect the active electrodes of both NVRSs to each other, or connect the inert active electrodes of both NVRSs to each other. Two NVRSs in which the active electrodes of both NVRSs are connected to each other or the inert electrodes are connected to each other are called complementary NVRSs. When the inert electrodes of two NVRSs are connected each other, the two NVRSs can share a single inert electrode. In such a case, the coupling part of the two NVRSs is the shared inert electrode. Although the two NVRSs can similarly share a single active electrode, it is preferable to share the inert electrode in comparison with case of the shared active electrode from a viewpoint of compatibility with semiconductor fabrication processes.

Figure 6:
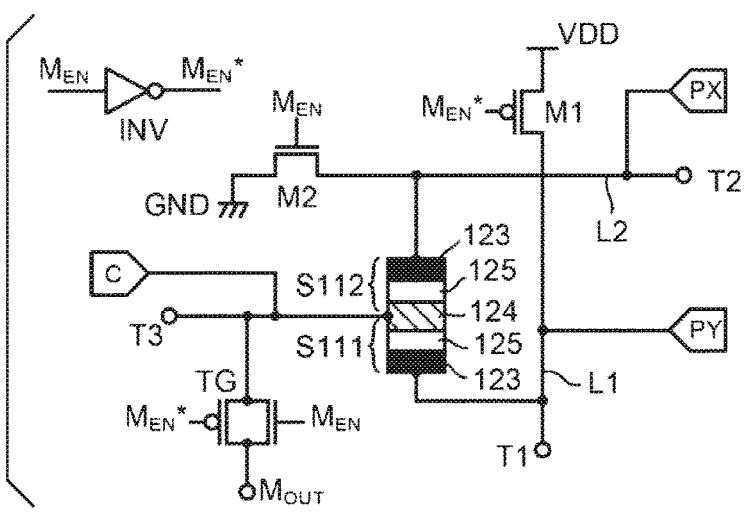
FIG. 6 is a circuit diagram illustrating another reconfigurable circuit according to the first exemplary embodiment.

FIG. 6 illustrates an example of the reconfiguration circuit with the shared inert electrode. Compared to the reconfigurable circuit shown in FIG. 2A, the reconfigurable circuit shown in FIG. 6 differs in that NVRSs S111, S112 share inert electrode 124, and that circuits for programming and reading NVRSs S111, S112 are added. The program circuit is used both for programming the NVRSs for the data routing mode and for writing data to the NVRSs for the memory mode. As switch elements SW1, SW2, pMOS transistor M1 and nMOS transistor M2 are used, respectively. Memory enable signal $M_{EN}$ which is active during reading operation is supplied to the reconfigurable circuit and invertor INV generates reversed memory enable signal $M_{EN}^*$ based on signal $M_{EN}$. Shared inert electrode 124 functions as the coupling part between NVRSs S111, S112. Program drivers PX, PY are connected to lines L1, L2, respectively, and program driver C is connected to the coupling part of NVRSs S111, S112. The coupling part is also connected to memory output terminal $M_{OUT}$ through transmission gate TG to which signals $M_{EN}$, $M_{EN}^*$ are supplied. Transistors M1, M2 are configured to turn on when memory enable signal $M_{EN}$ is asserted. Transmission gate TG is also turned on when memory enable signal $M_{EN}$ is asserted. The operation of the circuit shown in FIG. 6 in the data routing mode and the memory mode are the same as those of the circuit shown in FIG. 2A.

FIGS. 7A to 7D illustrate programing of NVRSs S111, S112 in the reconfigurable circuit shown in FIG. 6. Here, $V_{SET}$ is a voltage enough to change the state of NVRS from OFF-state to ON-state while $V_{RESET}$ is a voltage enough to change the state of NVRS from ON-state to OFF-state. It should be noted that application of voltage of $V_{SET}/2$, i.e., half of $V_{SET}$, does not cause the state change of NVRS, and application of $V_{RESET}/2$ does not cause the change of NVRS. In order to simplify the programming operation, it is preferable that magnitude of $V_{SET}$ is equal to that of $V_{RESET}$. Voltages $V_{PX}$, $V_{PY}$, $V_C$ are output voltages of program drivers PX, PY, C, respectively.

Figure 7A:
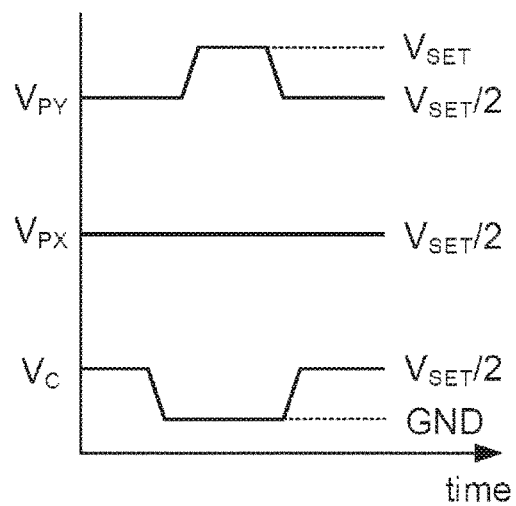
FIG. 7A to 7D are timing charts showing programming of the reconfigurable circuit shown in FIG. 6.
Figure 7B:
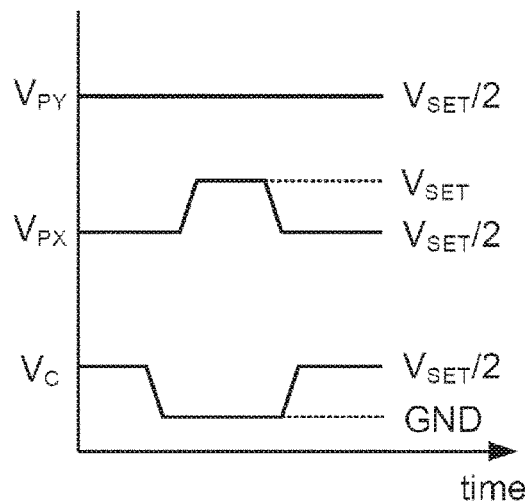

FIG. 7A illustrates the set operation for NVRS S111. In the initial stage, each of $V_{PX}$, $V_{PY}$, $V_C$ is maintained at level of $V_{SET}/2$. Then, $V_C$ is changed to the ground potential GND and $V_{PY}$ is subsequently changed to $V_{SET}$ whereby the state of NVRS S111 shifts into the ON-state. After the transition to the ON-state, $V_{PY}$ is changed back to $V_{SET}/2$ and $V_C$ is subsequently changed to $V_{SET}/2$. $V_{PX}$ is unchanged throughout the set operation of NVRS S111. FIG. 7B illustrates the set operation for NVRS S112. The set operation of NVRS S112 is similar to the set operation of NVRS S111, but $V_{PX}$ is changed instead of $V_{PY}$.

Figure 7C:
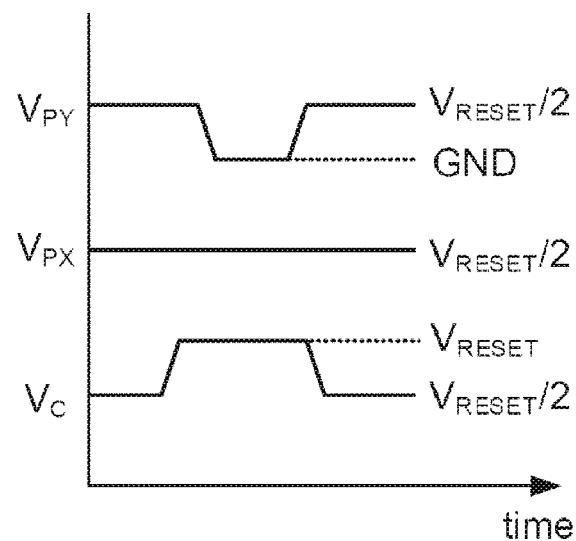
Figure 7D:
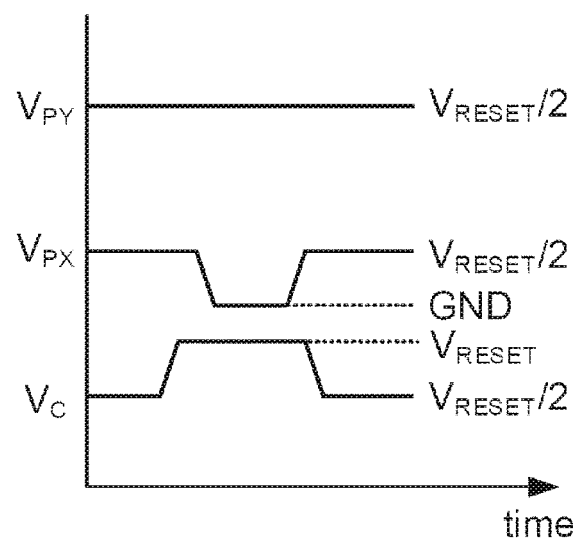

FIG. 7C illustrates the reset operation for NVRS S111. In the initial stage, each of $V_{PX}$, $V_{PY}$, $V_C$ is maintained at level of $V_{RESET}/2$. Then, $V_c$ is changed to $V_{RESET}$ and $V_{PY}$ is subsequently changed to the ground potential GND whereby the state of NVRS S111 shifts into the OFF-state. After the transition to the OFF-state, $V_{PY}$ is changed back to $V_{RESET}/2$ and $V_C$ subsequently is changed to $V_{RESET}/2$. $V_{PX}$ is unchanged throughout the reset operation of NVRS S111. FIG. 7D illustrates the reset operation for NVRS S112. The reset operation of NVRS S112 is similar to the reset operation of NVRS S111, but $V_{PX}$ is changed instead of $V_{PY}$.

Second Exemplary Embodiment

Figure 8:
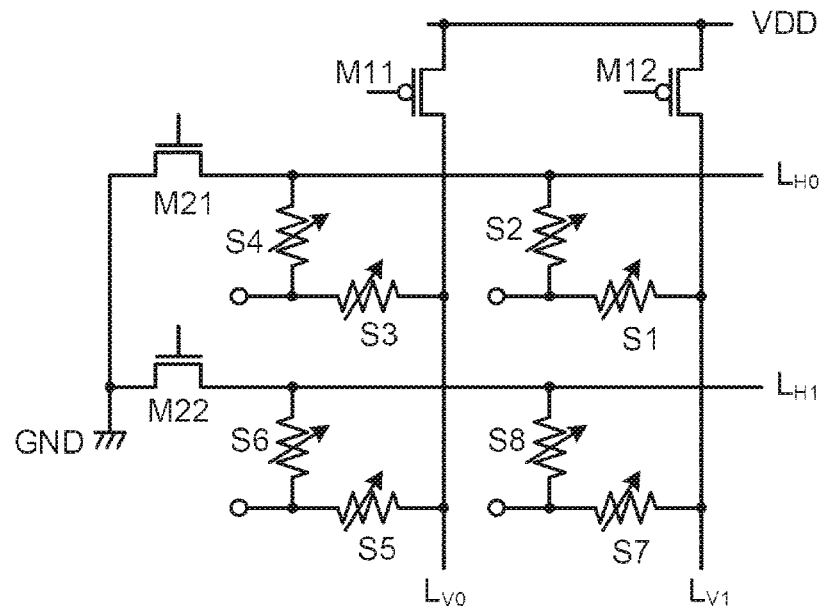
FIG. 8 is a circuit diagram illustrating a reconfigurable circuit according to a second exemplary embodiment.

Next, applications of the above-mentioned reconfigurable circuit will be described. FIG. 8 illustrates the reconfigurable circuit according to the second exemplary embodiment in which a plurality of first lines and a plurality of second lines are arranged and the resistive switch assembly including two NVRSs serially connected to each other is disposed at each cross-point between the first lines and the second lines. In the drawing, the first lines extend in the vertical direction while the second lines extend in the horizontal direction. In the present embodiment too, each resistive switch assembly is a one-input-two-output NB (Nonobridge®) which is used both for a data routing switch between the first line and the second line, and for a memory cell. In FIG. 8, different reference numerals are assigned to the NVRSs in different resistive switch arrays.

Figure 9A:
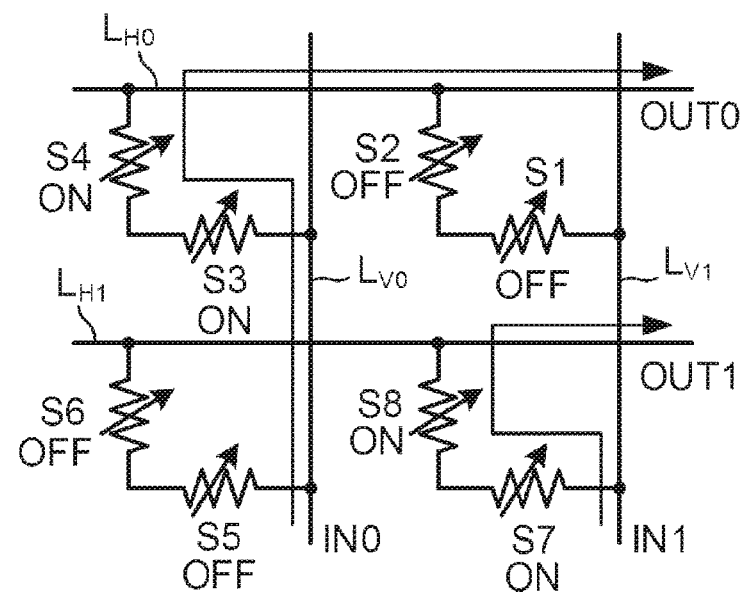
FIGS. 9A and 9B are circuit diagrams illustrating an example of operation of the reconfigurable circuit shown in FIG. 8.
Figure 9B:
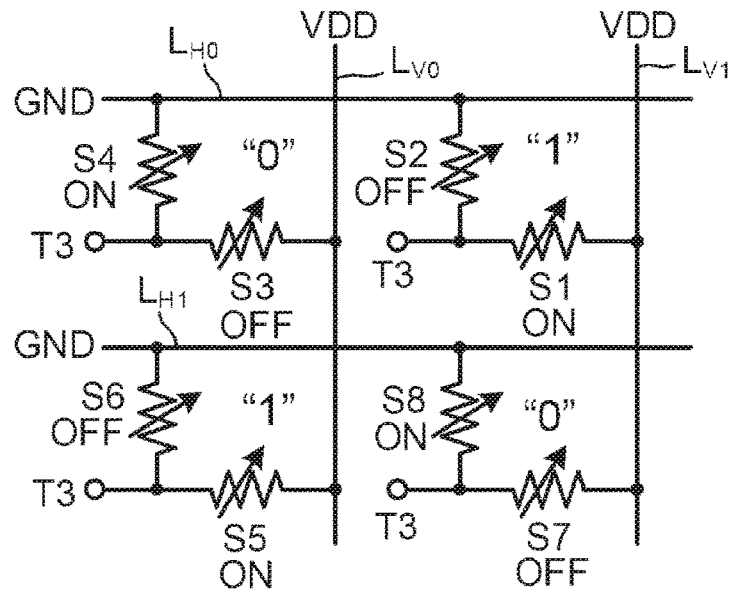

In the example shown in FIG. 8, two first or vertical lines $L_{V0}$, $L_{V1}$ and two second or horizontal lines $L_{H0}$, $L_{H1}$ are arranged in a lattice manner and a resistive switch assembly or Nonobridge® is arranged at each cross-point between vertical lines $L_{V0}$, $L_{V1}$ and horizontal lines $L_{H0}$, $L_{H1}$, thereby constituting a 2×2 NB crossbar. Total eight NVRSs S1 to S8 are contained in the circuit shown in FIG. 8. Vertical lines $L_{V0}$, $L_{V1}$ are coupled to power source line VDD via pMOS transistors M11, M12, respectively. Horizontal lines $L_{H0}$, $L_{H1}$ are coupled to ground line GND via nMOS transistors M21, M22, respectively. The resistive switch array at the cross-point between lines $L_{V1}$ and $L_{H0}$ includes NVRSs S1 and S2 and the resistive switch array at the cross-point between lines $L_{V0}$ and $L_{H0}$ includes NVRSs S3 and S4. Similarly, NVRSs S5 and S6 are arranged at the cross-point between lines $L_{V0}$ and $L_{H1}$, and NVRSs S7 and S8 are arranged at the cross-point between lines $L_{V1}$ and $L_{H1}$. NVRSs S1, S3, S5, S7 are the first NVRSs, and NVRSs S2, S4, S6, S8 are the second NVRSs. The NB crossbar shown in FIG. 8 can implement both a routing multiplexer (MUX) and a memory array and has different operational modes, i.e., data routing mode and memory mode. FIG. 9A and FIG. 9B illustrate the data routing mode and the memory mode of the circuit shown in FIG. 8, respectively.

In the data routing mode, transistors M11, M12, M21, M22 are cut off. It is assumed that ends of vertical lines $L_{V0}$, $L_{V1}$ are input ends IN0, IN1, respectively, and ends of horizontal lines $L_{H0}$, $L_{H1}$ are output ends OUT1, OUT2, respectively. As shown in FIG. 9A, to implement a data transfer path from IN0 to OUT0 and another data transfer path from IN1 to OUT1, NVRSs S3, S4, S7, S8 are made ON-state while the NVRSs S1, S2, S5, S6 are made OFF-state. The two NVRSs at the same cross-point have the same ON/OFF state.

In memory mode, one of two NVRSs at each cross-point is made ON-state and the other OFF-state to store logic value "1" or "0." In the example illustrated in FIG. 9B, NVRSs S1, S2 are made ON and OFF, respectively, to store logic value "1." NVRSs S3, S4 are made OFF and ON, respectively, to store logic value "0." NVRSs S5, S6 are similarly configured to store logic value "1" and NVRSs S7, S8 are configured to store logic value "0." When the stored values of the memory array are read, transistors M11, M12, M21, M22 are turned on. Then, the voltage of terminal T3 which is connected to the coupling part between the two NVRSs at each cross-point indicates the stored logic value. In this case, when the stored value is "0," the voltage of terminal T3 approaches to GND while the voltage of terminal T3 approached to VDD when the stored value is "1."

Figure 10:
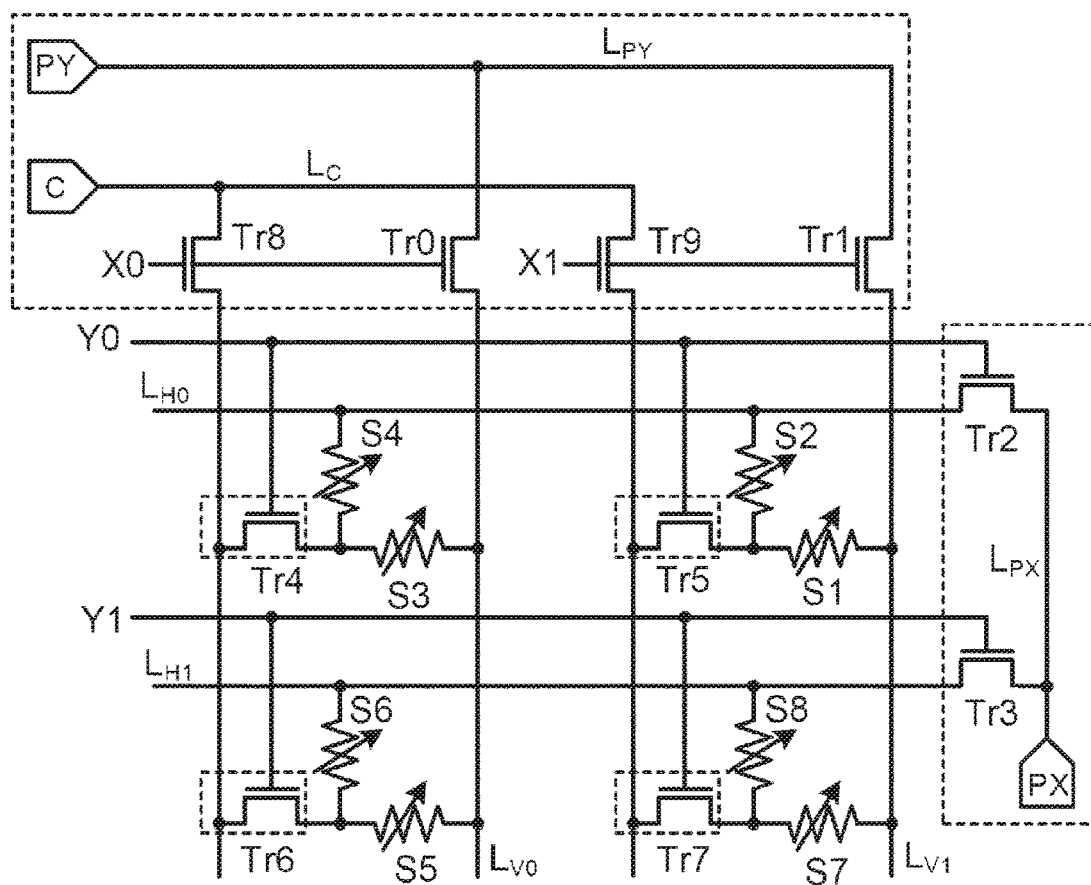
FIG. 10 is a circuit diagram of a reconfigurable circuit with a program circuit.

Programming of NVRSs in the reconfigurable circuit shown in FIG. 8 will be described. FIG. 10 illustrates a 2×2 NB crossbar in the related art which has only data routing function [NPL 2, PTL 1]. The circuit shown in FIG. 10 is equipped with a program circuit. Portions of the program circuit are surrounded by dashed lines in the drawing. Although the program circuit is used for separately programming NVRSs, the circuit shown in FIG. 10 does not implement a memory array. A control transistor is provided for each cross-point between the vertical lines and the horizontal lines. The source of the control transistor is connected to the coupling part between the two NVRSs at the same cross-point. In FIG. 10, nMOS transistors Tr4 to Tr7 are the control transistors at the respective cross-points. Diodes or the like may be used instead of the control transistors. Vertical lines $L_{V0}$, $L_{V1}$ are coupled to an output of a common column program driver PY via nMOS transistors Tr0, Tr1, respectively, and horizontal lines $L_{H0}$, $L_{H1}$ are coupled to an output of common row program driver PX via nMOS transistors Tr2, Tr3, respectively. The line connecting the output of column program driver PY to nMOS transistors Tr0, Tr1 is column program line $L_{PY}$, and the line connecting the output of row program driver PX to nMOS transistors Tr2, Tr3 is row program line $L_{PX}$. The drains of the control transistors on the same column are connected with each other, and then coupled to common mid program driver C via one of nMOS transistors Tr8, Tr9 which are provided for the respective columns. The line connecting the output of mid program driver C to nMOS transistors Tr8, Tr9 is mid program line $L_C$. Row address signals X0, X1 and column address signals Y0, Y1 control nMOS transistors Tr0 to Tr9 for configuration of the NB crossbar.

Figure 11:
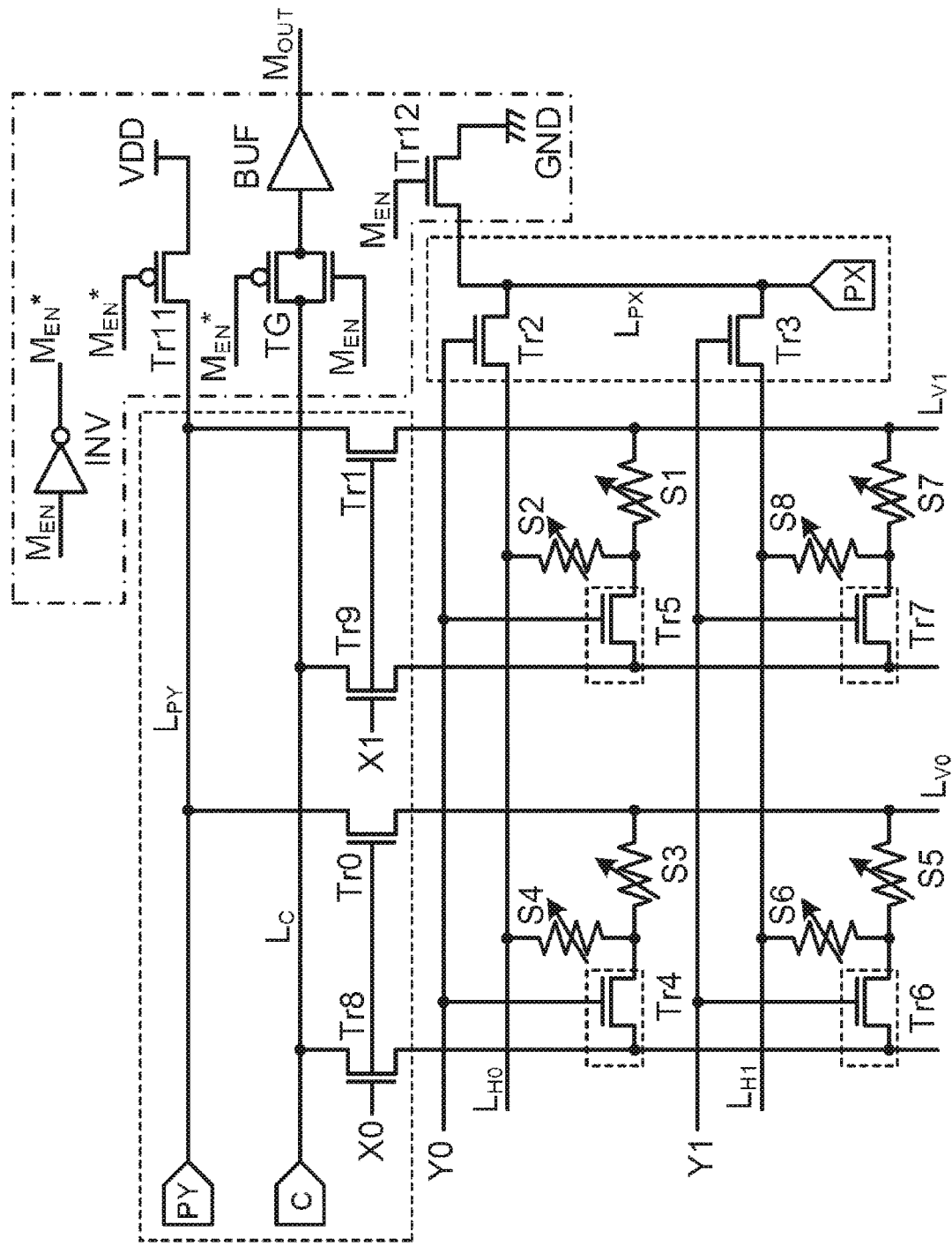
FIG. 11 is a circuit diagram of a reconfigurable circuit with a program circuit and a serial read circuit.

In order to realize the novel NB crossbar according to the second exemplary embodiment, which has both data routing function and memory function, we can add read circuits to the circuit of the related art shown in FIG. 10. FIG. 11 illustrates the reconfigurable circuit, i.e., NB crossbar, according to the second exemplary embodiment with a serial read circuit and the program circuit. The portions of the serial read circuit are surrounded by dashed-and-dotted lines while the portions of the program circuit are surrounded by dashed lines in the drawing.

In the example shown in FIG. 11, memory enable signal $M_{EN}$, which is in High level when asserted, is supplied to the read circuit, and its inverse signal $M_{EN}*$ is generated by inverter INV. Power supply voltage VDD is applied to column program line $L_{PY}$ via pMOS transistor Tr11 which is controlled by signal $M_{EN}*$. Ground potential GND is applied to row program line $L_{PX}$ via nMOS transistor Tr12 which is controlled by signal $M_{EN}$. Since the memory value is read from the coupling part of the two NVRSs of the same cross-point, the memory value is transferred to mid program line $L_C$ via the corresponding control transistor and one of nMOS transistors Tr8, Tr9. In order to supply the memory value to an external circuit, the mid program line is connected to buffer BUF via transmission gate TG controlled by signals $M_{EN}$, $M_{EN}*$. The output of buffer BUF is connected to memory output terminal $M_{OUT}$.

For example, when data stored in the NVRSs at the cross-point of vertical line $L_{V0}$ and horizontal line $L_{H0}$ is read, it is necessary to set signal $M_{EN}$ as High, addresses X0, Y0 as High, and addresses X1, Y1 as low. Transistor Tr0 is turned on to apply power supply voltage VDD to vertical line $L_{V0}$, and transistor Tr2 is turned on to apply ground potential GND to horizontal line $L_{H0}$. Transistors Tr4, Tr8 are then turned on to output the data stored in the NVRSs at the target cross-point.

Ten transistors Tr0 to Tr9 constitute the program circuit shown in FIG. 11 and these transistors Tr0 to Tr9 also engage in the read operation. Additional components for the serial read circuit is only two transistors Tr11, Tr12, one invertor INV, one transmission gate TG and one buffer BUF. This leads to very small area overhead of the novel NB crossbar with both routing switch function and memory function compared with the NB crossbar of the related art which has only the routing switch function.

Figure 12:
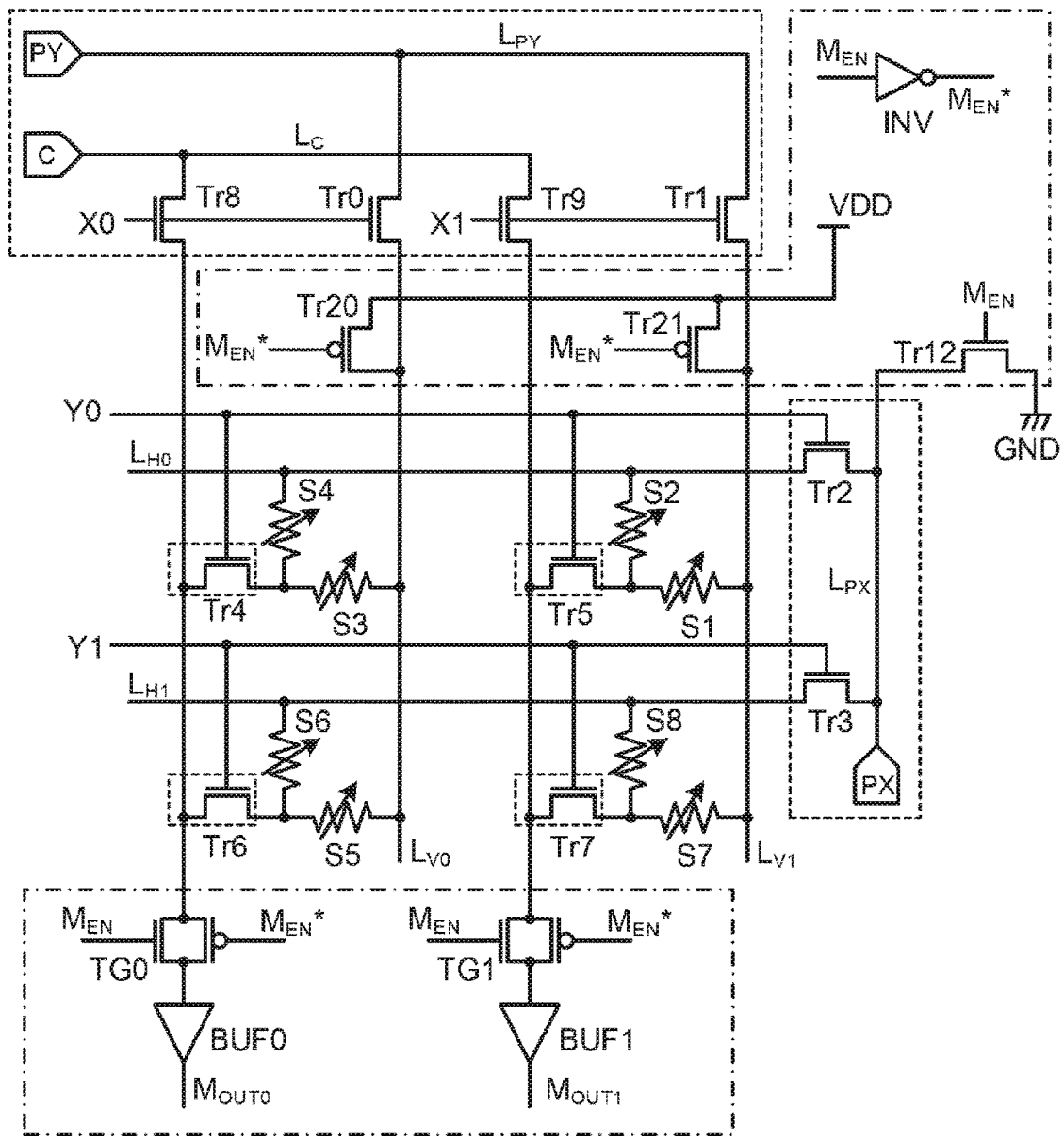
FIG. 12 is a circuit diagram of a reconfigurable circuit with a program circuit and a parallel read circuit.

The NB crossbar shown in FIG. 11 includes the serial read circuit. When a high memory read rate is required, the serial read circuit can be replaced with a parallel read circuit. FIG. 12 illustrates a reconfigurable circuit with a program circuit and a parallel read circuit which is modification of the circuit shown in FIG. 11. The circuit shown in FIG. 12 is different from the circuit shown in FIG. 11 only in a parallel read circuit is used instead of the serial read circuit. The portions of the parallel read circuit are surrounded by dashed-and-dotted lines in FIG. 12.

In the parallel read circuit, invertor INV reverses memory enable signal $M_{EN}$ to generate signal $M_{EN}*$. Vertical lines $L_{V0}$, $L_{V1}$ are connected to power source line VDD via pMOS transistors Tr20, Tr21, respectively. Transistors Tr20, Tr21 are controlled by signal $M_{EN}*$. Ground potential GND is applied to row program line $L_{PX}$ via nMOS transistor Tr12 controlled by signal $M_{EN}$. Transmission gates TG0, TG1 are provided for the respective columns. The drains of the control transistors on the same column are connected with each other, and then coupled to the corresponding one of transmission gates TG0, TG1. Each of transmission gates TG0, TG1 is controlled by signals $M_{EN}$, $M_{EN}*$. The outputs of transmission gates TG0, TG1 are connected memory output terminals $M_{OUT0}$, $M_{OUT1}$ via buffers BUF0, BUF1, respectively.

The circuit shown in FIG. 12 can read memory cells on the same row at the same time. When parallel reading is carried out, power source voltage VDD is applied, without using transistor Tr0, Tr1, to vertical lines $L_{V0}$, $L_{V1}$ via transistors Tr20, Tr21 controlled by signal $M_{EN}*$. The memory data is supplied to the transmission gates and buffers for parallel read without using transistors Tr8, Tr9. For example, if the data stored in the NVRSs at the cross-point of vertical line $L_{V0}$ and horizontal line $L_{H0}$ and another data stored at the cross-point of vertical lines $L_{V1}$ and horizontal line $L_{H0}$ are read simultaneously, it is necessary to set signal $M_{EN}$ as High, address Y0 as High, and address Y1 as low. Signal $M_{EN}$ at High causes voltage VDD to be supplied to both vertical lines $L_{V0}$, $L_{V1}$. Ground potential GND is supplied to horizontal line $L_{H0}$ because transistor Tr2 is turned on by address Y0. Transistors Tr4, Tr5 are turned on by address Y0, so that memory data corresponding to the cross-point of lines $L_{V0}$, $L_{H0}$ and another data corresponding to the cross-point of lines $L_{V1}$, $L_{H0}$ can be read to memory output terminals $M_{OUT0}$, $M_{OUT1}$, simultaneously. Thus, data stored in the row corresponding to horizontal line $L_{H0}$ have been read out in parallel.

In the examples described above, two vertical lines $L_{V0}$, $L_{V1}$ and two horizontal lines $L_{H0}$, $L_{H1}$ are arranged to constitute a crossbar. However, each of the number of the vertical lines and the number of horizontal lines is not limited to two. Three or more vertical lines can be arranged and three or more horizontal lines can be arranged. The larger scale of the lattice structure of the vertical lines and the horizontal lines further improves flexibility of the reconfigurable circuit.

Third Exemplary Embodiment

The reconfigurable circuit based on the present invention can be also applied to time-multiplexed crossbar or interconnect structures, such as proposed in [PTL 3], in which a plurality of switches are arranged at each of cross-points between horizontal lines and vertical lines and the switches are selected in time-divisional manner such that two or more switches are not simultaneously selected. The time-multiplexed crossbar achieves time-divisional changeover of contexts in FPGA. The selection of the switches is performed by using a pass transistor interposed in each switch. Time control signals are applied to the respective pass transistors at each cross-point. Since the selection using the pass transistors can be rapidly executed, the time-multiplex crossbar configuration provides runtime-changeable data signal routing which improves flexibility of FPGA.

Figure 13:
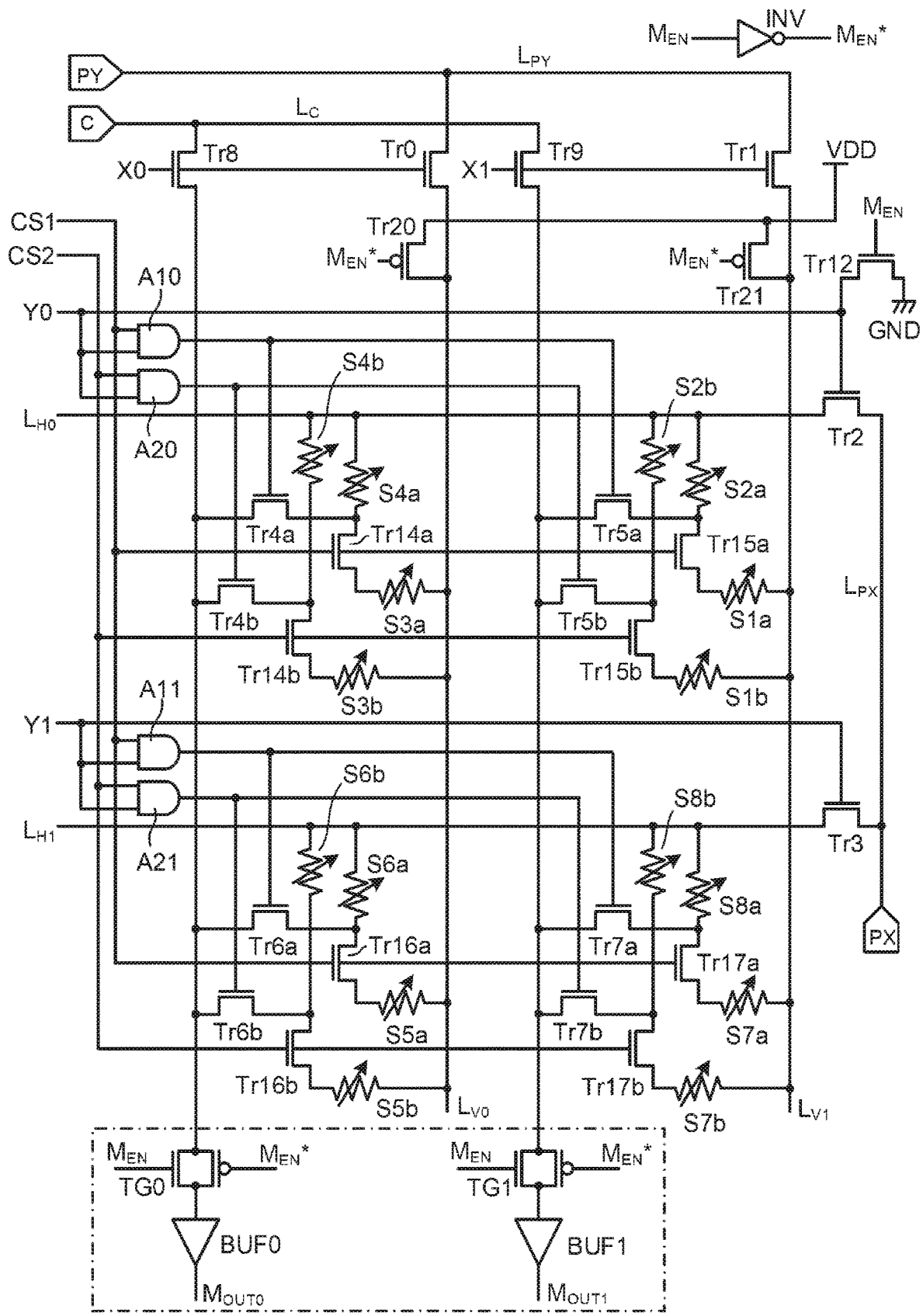
FIG. 13 is a circuit diagram illustrating a reconfigurable circuit according to a third exemplary embodiment.

FIG. 13 illustrates an example of a reconfigurable circuit according to a third exemplary embodiment in which a plurality of resistive switch assemblies each comprising two NVRSs serially-connected to each other are arranged at each cross-points between the vertical lines and the horizontal lines. The example shown in FIG. 13 is a modification of the circuit shown in FIG. 12 and is thus equipped with two resistive switch assemblies at each cross-point between two vertical lines $L_{V0}$, $L_{V1}$ and two horizontal lines $L_{H0}$, $L_{H1}$. However, three or more vertical lines and three or more horizontal lines can be arranged. In addition, although two resistive switch assemblies are arranged at each cross-point, the number of resistive switch assemblies per cross-point between the first lines, i.e., the vertical lines, and the second lines, i.e., the second lines, can be three or more. The multiplicity of contexts which are switched in a time-divisional manner increases as the number of resistive switch assemblies per cross-point increases.

A pass transistor is arranged in each of the resistive switch assemblies such that the pass transistor can interrupt the current flowing through the serially-connected two NVRSs in the resistive switch assembly. In FIG. 13, two resistive switch assemblies are arranged at the cross-point of vertical line $L_{V1}$ and horizontal line $L_{H0}$, the first assembly including two NVRSs S1$a$, S2$a$ and pass transistor Tr15$a$, and the second assembly including two NVRSs S1$b$, S2$b$ and pass transistor Tr15$b$. In the first resistive switch assembly, the second ends of NVRSs S1$a$, S1$b$ are connected to lines $L_{V1}$, $L_{H0}$, respectively, and pass transistor Tr15$a$ which is an nMOS transistor is inserted between the first ends of NVRSs S1$a$, S2$a$. The source of control transistor Tr5$a$ is connected to the junction between first end of NVRS S2$a$ and pass transistor Tr15$a$. Similarly, in the second resistive switch assembly, the second ends of NVRSs S1$b$, S2$b$ are connected to lines $L_{V1}$, $L_{H0}$, respectively, and pass transistor Tr15$b$ is inserted between the first ends of NVRSs S1$b$, S2$b$. Control transistor Tr5$b$ is connected to the junction between first end of NVRS S2$b$ and pass transistor Tr15$b$. The drains of control transistors Tr5$a$, Tr5$b$ are commonly connected to the drains of the other control transistors Tr7$a$, Tr7$b$ in the same column, and then connected to transistor Tr9 which is controlled by address X1.

Similarly, NVRSs S3$a$, S3$b$, S4$a$, S4$b$, control transistors Tr4$a$, Tr4$b$ and pass transistors Tr14$a$, Tr14$b$ are arranged for the cross-point between lines $L_{V0}$ and $L_{H0}$. NVRSs S5$a$, S5$b$, S6$a$, S6$b$, control transistors Tr6$a$, Tr6$b$ and pass transistors Tr16$a$, Tr16$b$ are arranged for the cross-point between lines $L_{V0}$ and $L_{H1}$. NVRSs S7$a$, S7$b$, S8$a$, S8$b$, control transistors Tr7$a$, Tr7$b$ and pass transistors Tr17$a$, Tr17$b$ are arranged for the cross-point between lines $L_{V1}$ and $L_{H1}$.

Two time control signals CS1, CS2 are supplied to the reconfigurable circuit. Signal CS1 is applied to the gates of pass transistors Tr14$a$, Tr15$a$, Tr16$a$, Tr17$a$ which are included in the first resistive switch assemblies at the respective cross-points. Signal CS2 is applied to the gates of pass transistors Tr14$b$, Tr15$b$, Tr16$b$, Tr17$b$ which are included in the second resistive switch assemblies at the respective cross-points. In addition, AND gate A10 receives time control signal CS1 and address Y0, and the output of AND gate A10 is supplied to the gates of controls transistors Tr4$a$, Tr5$a$ in the first resistive assemblies on horizontal line $V_{H0}$. Similarly, AND gate A20 receives time control signal CS2 and address Y0, and the output of AND gate A20 is supplied to the gates of controls transistors Tr4$b$, Tr5$b$ in the second resistive assemblies on horizontal line $V_{H0}$. With regard to vertical line $V_{H1}$, two AND gates A11, A21 are similarly provided and their outputs are supplied to the gates of control transistors Tr6$a$, Tr7$a$, Tr6$b$, Tr7$b$.

Although the pass transistor is inserted between the first ends of the first NVRS and the second NVRS for each cross-point in the example shown in FIG. 13, the position of the pass transistor is not limited to this. The pass transistor can be disposed at an arbitrary position between the coupling position of the first NVRS to the first line and the coupling position of the second NVRS to the second line. For example, in the case of the cross-point of vertical line $L_{V1}$ and horizontal line $L_{H0}$ shown in FIG. 13, pass transistor Tr15$a$ may be inserted between vertical line $L_{V1}$ and the second end of NVRS S1$a$. Alternatively, pass transistor Tr15$a$ may be inserted between horizontal line $L_{H0}$ and the second end of NVRS S2$a$.

The operation of the reconfigurable circuit shown in FIG. 13 is the same as that of the circuit shown in FIG. 12 except for selection of one of two resistive switch assemblies at each cross-point by means of time control signals CS1, CS2. When the first resistive switch assemblies or NBs are used for data routing switches or memory cells, time control signal CS1 is activated while time control signal CS2 is kept inactive. On the other hand, if the second resistive switch assemblies are used for data routing switches or memory cells, time control signal CS2 is activated while time control signal CS1 is kept inactive. The programming operation to the NVRSs is also carried out by activating one of time control signals CS1, CS2.

Fourth Exemplary Embodiment

Figure 1:
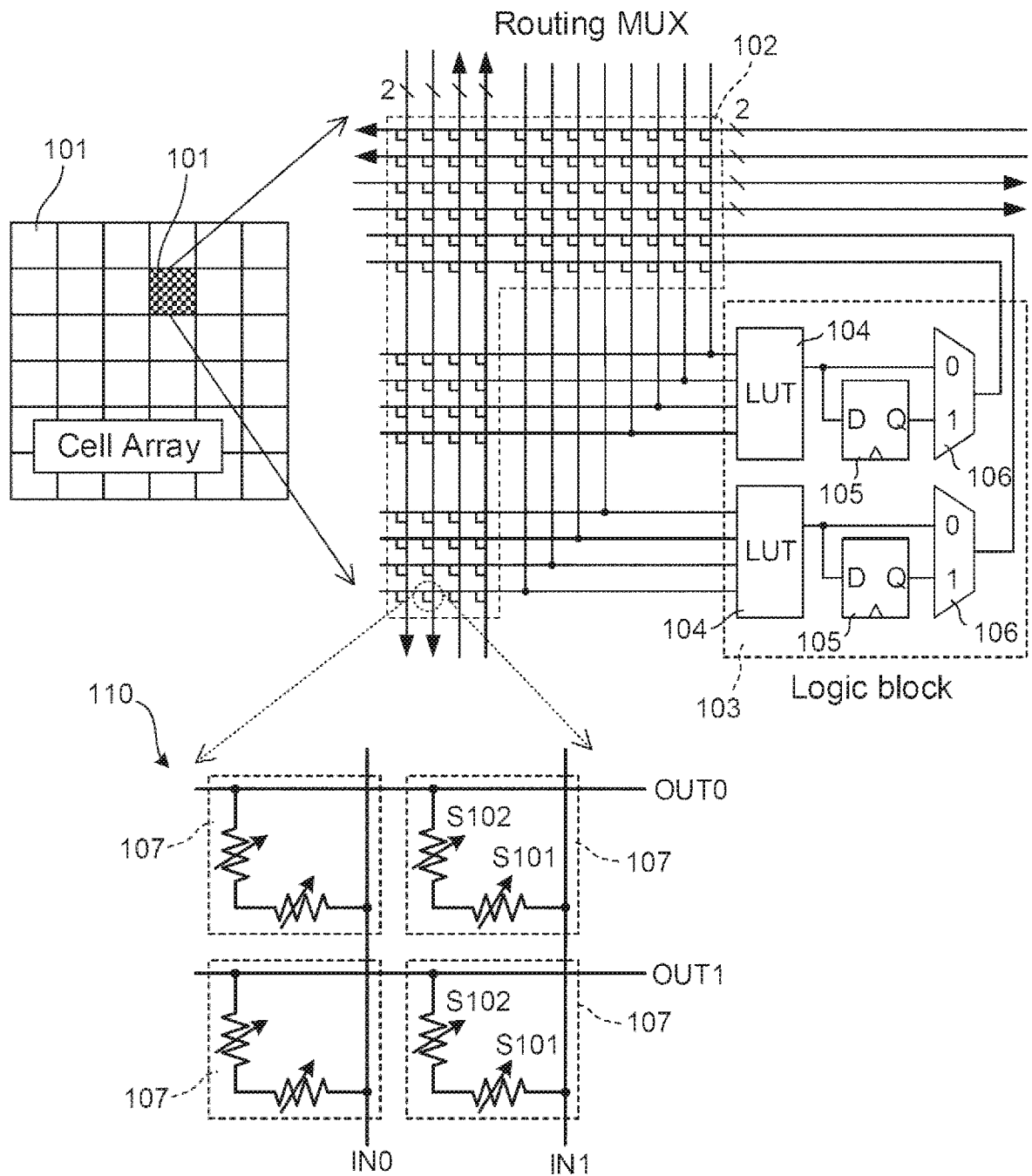
FIG. 1 is a schematic view illustrating an exemplary structure of NBFPGA.
Figure 14A:
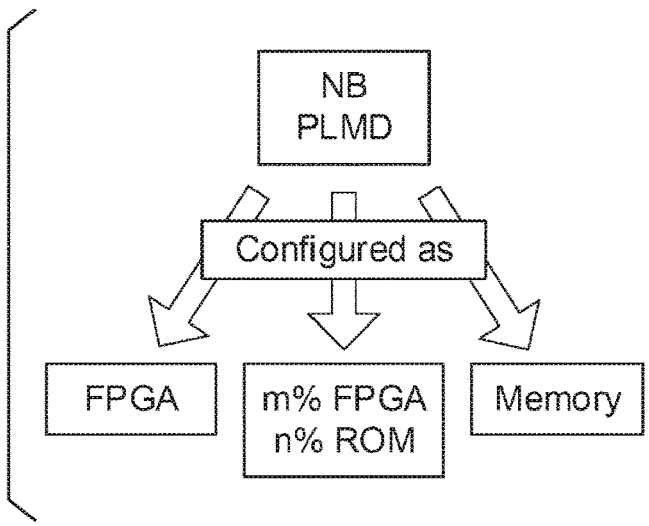
FIGS. 14A and 14B are views explaining flexible configuration of NBPLMD (Nanobridge® programmable logic memory device) according to a fourth exemplary embodiment.
Figure 14B:
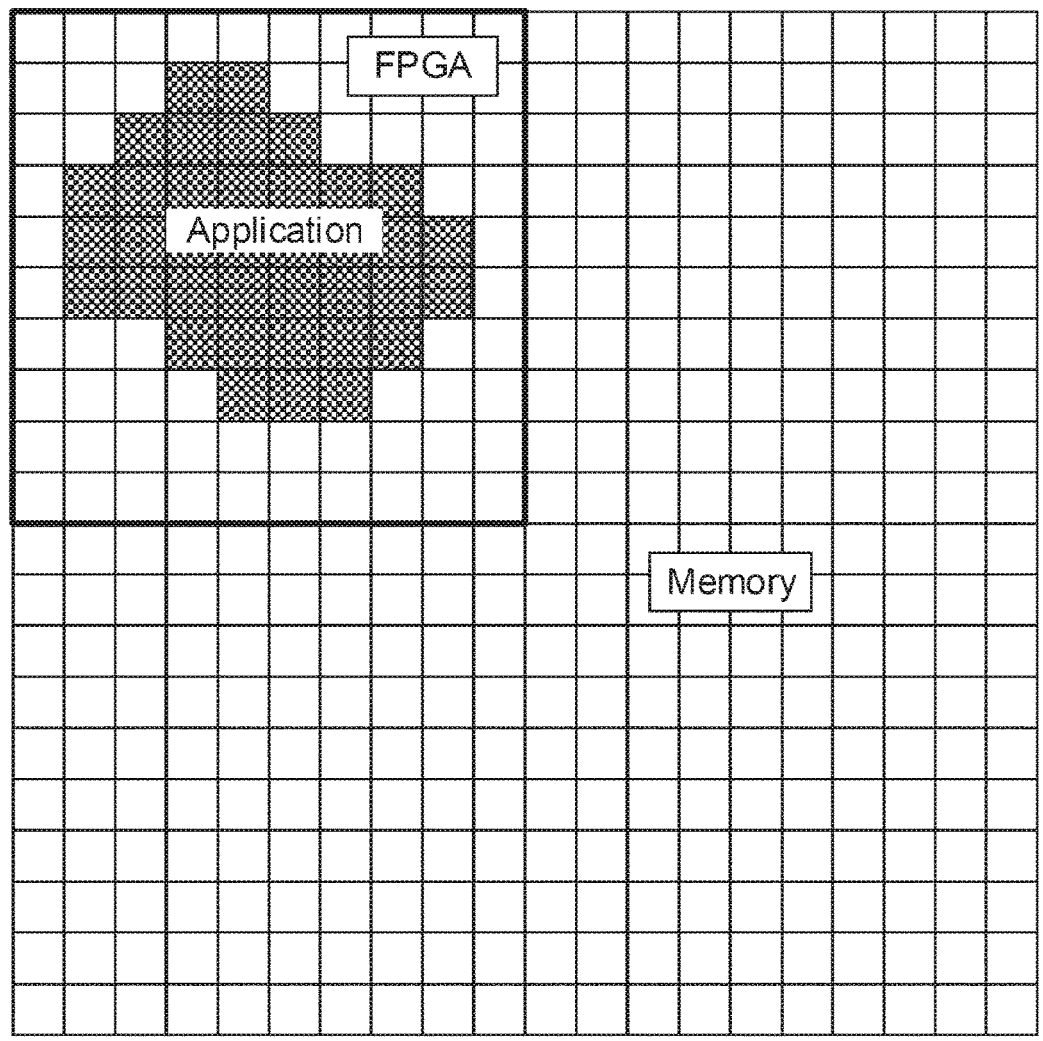

Next, a fourth exemplary embodiment according to the present invention will be explained. As described above, the reconfigurable circuits of the above exemplary embodiments are called as NBPLMD. The present exemplary embodiment explains how to use the novel NBPLMD. FIGS. 14A and 14B illustrate usage of the novel NBPLMD. The NBPLMD has the same structure as the previous NBFPGA shown in FIG. 1, but with the novel NB crossbar which can be used for both a data routing switch and a memory, as disclosed in the above exemplary embodiments. As shown in FIG. 14A, there are three kinds of usage for the NBPLMD. The first one is that the NBPLMD is configured as a complete NBFPGA if a large-sized application is mapped on the NBPLMD. The second one is that the NBPLMD is configured as a complete memory if only data storage is necessary. The third one is that one part of the NBPLMD is configured as NBFPGA and the other part is configured as a memory if both application and memory are necessary simultaneously. The example shown in FIG. 14B illustrates the case where an application can be realized using 25% of the NBPLMD, the other 75% can be used as a programmable ROM (read only memory). The area ratio between the NBFPGA part and the memory part can be arbitrarily set between the ranges of 1:0 and 0:1. Since the data routing mode, i.e., NBFPGA mode, and the memory mode are different only in the state of memory enable signal $M_{EN}$ and data pattern written to the serially connected two NVRSs in each NB, the mode of NBPLMD can be dynamically change between the NBFPGA mode and the memory mode for each block in the NBPLMD during the operation of the NBPLMD.

Figure 15:
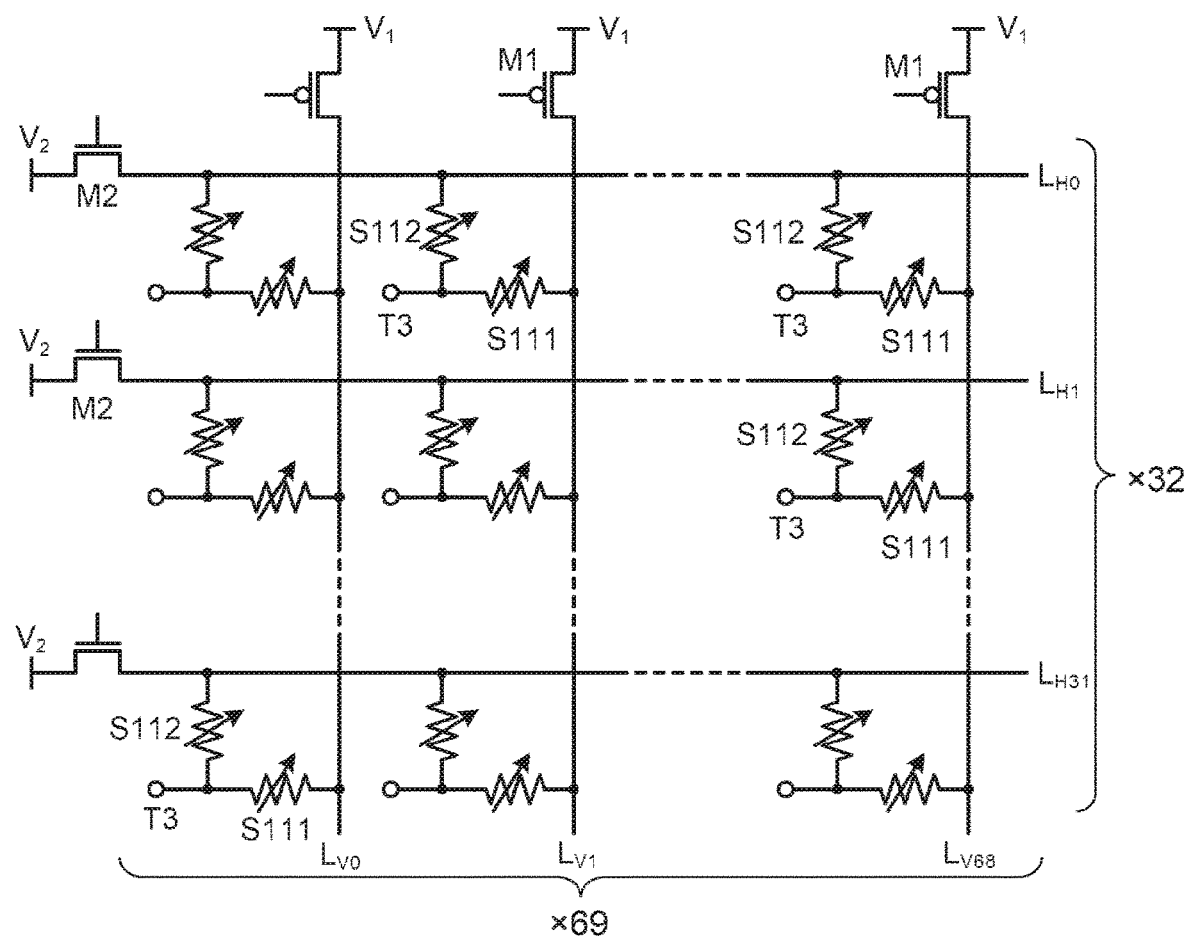
FIG. 15 is a circuit diagram illustrating a cell of NBPLMD.

FIG. 15 illustrates how a large size FPGA or memory can be provided by NBPLMD with a typical architecture. In this example, it is assumed that cluster size, segment length and segment lane are optimized to be 4 as introduced in [NPL 3], and a cell array of 64×64 cells are arranged in NBPLMD. Each cell has four look-up tables (LUTs), therefore totally 64×64×4=16384 LUTs are provided in the FPGA mode of the NBPLMD. As shown in FIG. 15, each cell of NBPLMD has thirty-two (32) horizontal lines $L_{H0}$ to $L_{H31}$ and sixty-nine (69) vertical lines $L_{V0}$ to $L_{V68}$, therefore a 32×69 NB crossbar is formed per cell. Each of vertical lines $L_{V0}$ to $L_{V68}$ is coupled to the first power source line of voltage $V_1$ through pMOS transistor M1 which functions as the first switch element. Each of horizontal lines $L_{H0}$ to $L_{H31}$ is coupled to the second power source line of voltage $V_2$ through nMOS transistor M2 which functions as the second switch element. A resistive switch array including NVRSs S111, S112 and coupling terminal T3 is arranged at each of cross-points between horizontal lines $L_{H0}$ to $L_{H31}$ and vertical lines $L_{V0}$ to $L_{V68}$. In the memory mode, since 32×69×64×64=9,043,968, a 9-megabits memory is provided by the NBPLMD of the current example.

Fifth Exemplary Embodiment

Next, a fifth exemplary embodiment according to the present invention will be explained. As described in above exemplary embodiments, the area ratio between the NBFPGA part and the memory part in the NBPLMD can be arbitrarily set in a range between 1:0 and 0:1. In another word, there is a tradeoff between an NBFPGA area and a memory area in the NBPLMD. The present exemplary embodiment discloses how to break the tradeoff.

Figure 16:
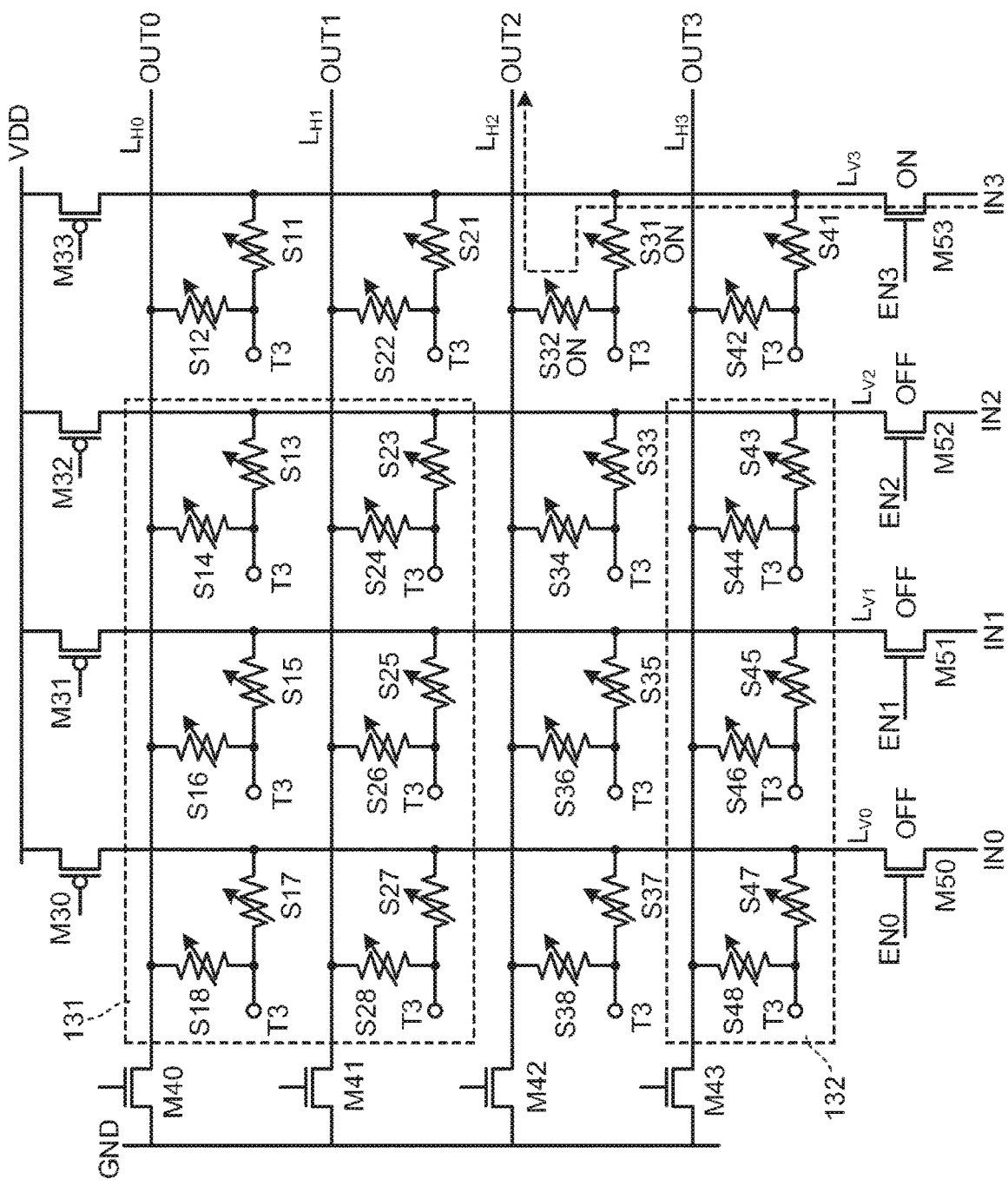
FIG. 16 is a circuit diagram illustrating a reconfigurable circuit according to a fifth exemplary embodiment.

FIG. 16 illustrates a reconfigurable circuit according to the fifth exemplary embodiment. Four vertical lines $L_{V0}$ to $L_{V3}$ and four horizontal lines $L_{H0}$ to $L_{H3}$ are arranged in a lattice manner and a resistive switch assembly or Nanobridge® is arranged at each cross-point between vertical lines $L_{V0}$ to $L_{V3}$ and horizontal lines $L_{H0}$ to $L_{H3}$, thereby constituting a 4×4 NB crossbar. Total 32 NVRSs S11 to S18, S21 to S28, S31 to S38, S31 to S38 are contained in the circuit shown in FIG. 16. For example, NVRSs S11, S12 are arranged at the cross-point between vertical line $L_{V3}$ and horizontal line $L_{H0}$ and terminal T3 is connected to the coupling part or node between first NVRS S11 and second NVRS S12. Similarly to the NB crossbar disclosed in the second exemplary embodiment, vertical lines $L_{V0}$ to $L_{V3}$ are coupled to power source line VDD via pMOS transistors M30 to M33, respectively. Horizontal lines $L_{H0}$ to $L_{H3}$ are coupled to ground line GND via nMOS transistors M40 to M43, respectively. The NB crossbar of the present exemplary embodiment differs from the NB crossbar of the second exemplary embodiment in that vertical lines $L_{V0}$ to $L_{V3}$ are connected to input ends IN0 to IN3 via input control switches M50 to M53, respectively. Horizontal lines $L_{H0}$ to $L_{H3}$ are directly connected to output ends OUT0 to OUT3, respectively. Here, we use nMOS transistors for input control switches M50 to M53 as an example, the input control switches may be transmission gates, NVRSs or other controllable switches. Input enable signals EN0 to EN3 are applied to the gate terminals of the input control switch transistors M51 to M53 for ON/OFF control, respectively.

In case of implementing a data transfer path from input end IN3 to output end OUT2, input control switch transistor M53, which corresponds to input end IN3, and NVRS S31, S32 are made ON-state while remaining input control switch transistors M50, M51, M53 and transistors M33, M42 are made OFF-state. To achieve high reliability in the OFF-state, the other NVRSs S11, S12, S21, S22, S33 to S38, S41, S42 which are connected to vertical line $L_{V3}$ or horizontal line $L_{H2}$ are preferably made OFF-state, because when a signal is applied to input end IN0 and propagates on vertical line $L_{V3}$ and horizontal line $L_{H2}$, the applied signal causes voltage stress on the NVRSs and the transistors coupled to vertical line $L_{V3}$ or horizontal line $L_{H2}$. Input control switches M50 to M52 which are in the OFF-state cut off input signals applied to input ends IN0 to IN2 so that the NVRSs S13 to S18, S23 to S28, S43 to S48 can be used as memory cells without reliability problem. Block 131 including NVRSs S13 to S18, S23 to S28 constitutes six memory cells, and block 132 including NVRSs S43 to S48 constitutes three memory cells. Both memory cells and data routing switches can be implemented in the same NB crossbar. As a result, both memory and NBFPGA can be installed on the whole area of the NBPLMD.

Although, in the circuit shown in FIG. 15, vertical lines $L_{V0}$ to $L_{V3}$ are coupled to input ends IN0 to IN3 via input control transistors M50 to M53 and horizontal lines $L_{H0}$ to $L_{H3}$ are coupled to output ends OUT0 to OUT3, another configuration is possible in which the vertical lines are coupled to the output ends while horizontal lines are coupled to the input ends via the input control transistors. In the present exemplary embodiment, the number of the vertical lines is not limited to four and the number of the horizontal lines is not limited to four.

The reconfigurable circuits of the above exemplary embodiments may be used in, for example, mobile phones, IoT (Internet of Things) devices, and so on. A highly flexible PLMD (programmable logic memory device) can be realized by the reconfigurable circuits described above.

It is apparent that the present invention is not limited to the above exemplary embodiments and examples, but may be modified and changed without departing from the scope and sprit of the invention. The present application claims priority based on international application PCT/JP2016/002358 filed on May 13, 2016, all the disclosure of which is incorporated herein.

The whole or part of the exemplary embodiments disclosed above can be described as, but not limited to, the following supplementary notes.

(Supplementary Note 1)

A reconfigurable circuit comprising:

a first line;

a first switch element disposed between the first line and a first power source line of first voltage;

a second line;

a second switch element disposed between the second line and a second power source line of second voltage which is different from the first voltage; and a resistive switch assembly disposed between the first line and the second line, the resistive switch assembly including a first non-volatile resistive switch and a second non-volatile resistive switch whose first end is coupled to a first end of the first non-volatile resistive switch, wherein a second end of the first non-volatile resistive switch is coupled to the first line, and a second end of the second non-volatile resistive switch is coupled to the second line.

(Supplementary Note 2)

The reconfigurable circuit according to Supplementary Note 1, wherein one of the first voltage and the second voltage is a power supply voltage, and the other of the first voltage and the second voltage is ground potential.

(Supplementary Note 3)

The reconfigurable circuit according to Supplementary Note 1 or 2, wherein each of the first non-volatile resistive switch and the second non-volatile resistive switch comprises an active electrode, an inert electrode, and a solid-electrolyte sandwiched between the active electrode and the inert electrode.

(Supplementary Note 4)

The reconfigurable circuit according to Supplementary Note 3, wherein the active electrodes of the first non-volatile resistive switch and the second non-volatile resistive switch are coupled to each other, or the inert electrodes of the first non-volatile resistive switch and the second non-volatile resistive switch are coupled to each other.

(Supplementary Note 5)

The reconfigurable circuit according to any one of Supplementary Notes 1 to 4, wherein each of the first switch element and the second switch element comprises a MOS transistor.

(Supplementary Note 6)

The reconfigurable circuit according to any one of Supplementary Notes 1 to 5, wherein the first switch element and the second switch element are turned on in accordance with a memory enable signal.

(Supplementary Note 7)

The reconfigurable circuit according to any one of Supplementary Notes 1 to 6, wherein a value stored in the resistive switch array is read out from a coupling part of the first end of the first non-volatile resistive switch element and the first end of the second non-volatile resistive element.

(Supplementary Note 8)

The reconfigurable circuit according to any one of Supplementary Notes 1 to 6, further comprising:

a first program driver applying a first program voltage to the first line; a second program driver applying a second program voltage to the second line; and a third program driver applying a third program voltage to a coupling part of the first ends of the first non-volatile resistive switch and the second non-volatile resistive switch.

(Supplementary Note 9)

The reconfigurable circuit according to Supplementary Note 8, wherein a value stored in the resistive switch array is read out from the coupling part.

(Supplementary Note 10)

The reconfigurable circuit according to any one of Supplementary Notes 1 to 9, wherein a plurality of the resistive switch assemblies are disposed between the first line and the second line, and a pass transistor is arranged in each of the plurality of the resistive switch assemblies such that the pass transistor is inserted in a section between a coupling position of the first non-volatile resistive switch to the first line and a coupling position of the second non-volatile resistive switch to the second line.

(Supplementary Note 11)

The reconfigurable circuit according to Supplementary Note 10, wherein a time control signal is applied to a gate of the pass transistor.

(Supplementary Note 12)

The reconfigurable circuit according to any one of Supplementary Notes 1 to 7, wherein a plurality of first lines and a plurality of second lines are arranged, and the resistive switch assembly is disposed at each of cross-points between the plurality of first lines and the plurality of second lines.

(Supplementary Note 13)

The reconfigurable circuit according to Supplementary Note 12, wherein the first switch element is provided for each of the plurality of the first lines and the second switch element is provided for each of the plurality of the second lines.

(Supplementary Note 14)

The reconfigurable circuit according to Supplementary Note 12 or 13, wherein a plurality of the resistive switch assemblies are disposed at each of the cross-points, and a pass transistor is arranged in each of the plurality of the resistive switch assemblies such that the pass transistor is inserted in a section between a coupling position of the first non-volatile resistive switch to the first line and a coupling position of the second non-volatile resistive switch to the second line.

(Supplementary Note 15)

The reconfigurable circuit according to Supplementary Note 14, wherein a time control signal is applied to a gate of the pass transistor.

(Supplementary Note 16)

The reconfigurable circuit according to any one of Supplementary Notes 1 to 15, further comprising:

a third switch element whose first end is coupled to one of the first line and the second line, a second end of the third switch element being used as an input end.

(Supplementary Note 17)

The reconfigurable circuit according to Supplementary Note 16, wherein the third switch element comprises a MOS transistor.

(Supplementary Note 18)

The reconfigurable circuit according to Supplementary Note 16 or 17, wherein the third switch element is turned on in accordance with an input enable signal.

(Supplementary Note 19)

A reconfigurable circuit comprising:

a plurality of first lines;

a plurality of first selection transistors respectively connected to the plurality of first lines and controlled by first address, a plurality of second lines;

a plurality of second selection transistors respectively connected to the plurality of second lines and controlled by second address, a resistive switch assembly disposed at each of cross-points between the plurality of first lines and the plurality of second lines, the resistive switch assembly including a first non-volatile resistive switch and a second non-volatile resistive switch whose first end is coupled to a first end of the first non-volatile resistive switch, a first switch element connecting at least one of the first lines to a first power source line of first voltage in response to a memory enable signal; and a second switch element connecting at least one of the second lines to a second power source line of second voltage in response to the memory enable signal, the second voltage being different from the first voltage, wherein, in each resistive switch assembly, a second end of the first non-volatile resistive switch is coupled to the first line, and a second end of the second non-volatile resistive switch is coupled to the second line.

(Supplementary Note 20)

The reconfigurable circuit according to Supplementary Note 19, further comprising:

a plurality of third lines respectively provided for the plurality of the first lines;

a control transistor provided for each cross-point, one end of the control transistor being connected to a coupling part of the first end of the first non-volatile resistive switch and the first end of the second non-volatile resistive switch, the other end of the control transistor being connected to one of the third lines corresponding to the each cross-point, an address signal of the second address corresponding to the each cross-point being applied to a gate of the control transistor;

a fourth line;

a plurality of third selection transistors respectively connecting the plurality of third lines to the fourth line;

a first program driver applying a first program voltage to the plurality of first lines through the plurality of first selection transistors;

a second program driver applying a second program voltage to the plurality of second lines through the plurality of second selection transistors; and a third program driver applying a third program voltage to the fourth line.

(Supplementary Note 21)

The reconfigurable circuit according to Supplementary Note 20, wherein stored values associated with the cross-points are serially read through the fourth line in response to the memory enable signal.

(Supplementary Note 22)

The reconfigurable circuit according to Supplementary Note 20, wherein stored values associated with the cross-points are read in parallel through the plurality of the third lines in response to the memory enable signal.

(Supplementary Note 23)

The reconfigurable circuit according to any one of Supplementary Notes 19 to 22, wherein one of the first voltage and the second voltage is a power supply voltage, and the other of the first voltage and the second voltage is ground potential.

(Supplementary Note 24)

The reconfigurable circuit according to any one of Supplementary Notes 19 to 23, wherein each of the first non-volatile resistive switch and the second non-volatile resistive switch comprises an active electrode, an inert electrode, and a solid-electrolyte sandwiched between the active electrode and the inert electrode.

(Supplementary Note 25)

The reconfigurable circuit according to Supplementary Note 24, wherein the active electrodes of the first non-volatile resistive switch and the second non-volatile resistive switch are coupled to each other, or the inert electrodes of the first non-volatile resistive switch and the second non-volatile resistive switch are coupled to each other.

(Supplementary Note 26)

The reconfigurable circuit according to any one of Supplementary Notes 19 to 25, wherein each of the first switch element and the second switch element comprises a MOS transistor.

(Supplementary Note 27)

The reconfigurable circuit according to any one of Supplementary Notes 19 or 26, wherein a plurality of the resistive switch assemblies are disposed at each of the cross-points, and a pass transistor is arranged in each of the plurality of the resistive switch assemblies such that the pass transistor is inserted in a section between a coupling position of the first non-volatile resistive switch to the first line and a coupling position of the second non-volatile resistive switch to the second line.

(Supplementary Note 28)

The reconfigurable circuit according to Supplementary Note 27, wherein a time control signal is applied to a gate of the pass transistor.

(Supplementary Note 29)

The reconfigurable circuit according to any one of Supplementary Notes 19 to 28, further comprising:

a plurality of third switch elements whose first ends are coupled to the plurality of first lines, respectively, wherein second ends of the third switch elements are used as input ends, and the plurality of second lines are coupled to output ends, respectively.

(Supplementary Note 30)

The reconfigurable circuit according to any one of Supplementary Notes 19 to 28, further comprising:

a plurality of third switch elements whose first ends are coupled to the plurality of second lines, respectively, wherein second ends of the third switch elements are used as input ends, and the plurality of first lines are coupled to output ends, respectively.

(Supplementary Note 31)

The reconfigurable circuit according to Supplementary Note 29 or 30, wherein each of the third switch elements comprises a MOS transistor.

(Supplementary Note 32)

The reconfigurable circuit according to any one of Supplementary Notes 29 to 31, wherein the third switch elements are turned on in accordance with an input enable signal.

(Supplementary Note 33)

A method for using reconfigurable circuit comprising a first line, a second line, and a resistive switch assembly disposed between the first line and the second line, wherein the resistive switch assembly includes a first non-volatile resistive switch and a second non-volatile resistive switch whose first end is coupled to a first end of the first non-volatile resistive switch, a second end of the first non-volatile resistive switch is coupled to the first line, and a second end of the second non-volatile resistive switch is coupled to the second line, the method comprising:

using the first non-volatile resistive switch and the second non-volatile resistive switch as a data routing switch between the first line and the second line, by selectively making one of a first state in which the first non-volatile resistive switch and the second non-volatile resistive switch are in ON-state, and a second state in which the first non-volatile resistive switch and the second non-volatile resistive switch are in Off-state; and using the first non-volatile resistive switch and the second non-volatile resistive switch as a memory element, by making one of the first non-volatile resistive switch and the second non-volatile resistive switch the ON-state and the other the OFF-state.

(Supplementary Note 34)

The method according to Supplementary Note 33, further comprising:

when used as the memory element, applying first voltage to the first line while applying second voltage to the second line, the second voltage being different from the first voltage; and reading stored value of the memory element from a coupling part of the first end of the first non-volatile resistive switch element and the first end of the second non-volatile resistive element.

(Supplementary Note 35)

The method according to Supplementary Note 34, further comprising:

applying a first program voltage to the first line;

applying a second program voltage to the second line; and applying a third program voltage to the coupling part, wherein the first non-volatile resistive switch and the second non-volatile resistive switch are separately made one of the ON-state and the OFF state by a combination of the first program voltage, the second program voltage and the third program voltage.

REFERENCE SIGNS LIST

111 Resistive switch assembly,
L1, L2 lines,
S111, S112 Non-volatile resistive switches (NVRSs),
T1, T2, T3 Terminals.

What is claimed is:

1. A reconfigurable circuit comprising:

a first line;

a first switch element disposed between the first line and
   a first power source line of first voltage;

a second line;

a second switch element disposed between the second line and a second power source line of second voltage which is different from the first voltage;

a resistive switch assembly disposed between the first line and the second line, the resistive switch assembly including a first non-volatile resistive switch and a second non-volatile resistive switch whose first end is coupled to a first end of the first non-volatile resistive switch; and a third switch element whose first end is coupled to one of the first line and the second line, wherein a second end of the third switch element is used as an input end, and wherein a second end of the first non-volatile resistive switch is coupled to the first line, and a second end of the second non-volatile resistive switch is coupled to the second line.

2. The reconfigurable circuit according to claim 1, wherein one of the first voltage and the second voltage is a power supply voltage, and the other of the first voltage and the second voltage is ground potential.

3. The reconfigurable circuit according to claim 1, wherein each of the first non-volatile resistive switch and the second non-volatile resistive switch comprises an active electrode, an inert electrode, and a solid-electrolyte sandwiched between the active electrode and the inert electrode.

4. The reconfigurable circuit according to claim 3, wherein the active electrodes of the first non-volatile resistive switch and the second non-volatile resistive switch are coupled to each other, or the inert electrodes of the first non-volatile resistive switch and the second non-volatile resistive switch are coupled to each other.

5. The reconfigurable circuit according to claim 1, wherein each of the first switch element and the second switch element comprises a MOS transistor.

6. The reconfigurable circuit according to claim 1, wherein the first switch element and the second switch element are turned on in accordance with a memory enable signal.

7. The reconfigurable circuit according to claim 1, wherein a value stored in the resistive switch array is read out from a coupling part of the first end of the first non-volatile resistive switch element and the first end of the second non-volatile resistive element.

8. The reconfigurable circuit according to claim 1, further comprising:

a first program driver applying a first program voltage to the first line;

a second program driver applying a second program voltage to the second line; and a third program driver applying a third program voltage to a coupling part of the first ends of the first non-volatile resistive switch and the second non-volatile resistive switch.

9. The reconfigurable circuit according to claim 8, wherein a value stored in the resistive switch array is read out from the coupling part.

10. The reconfigurable circuit according to claim 1, wherein a plurality of first lines and a plurality of second lines are arranged, and the resistive switch assembly is disposed at each of cross-points between the plurality of first lines and the plurality of second lines.

11. The reconfigurable circuit according to claim 10, wherein the first switch element is provided for each of the plurality of the first lines and the second switch element is provided for each of the plurality of the second lines.

12. The reconfigurable circuit according to claim 1, wherein the third switch element comprises a MOS transistor.

13. The reconfigurable circuit according claim 1, wherein the third switch element is turned on in accordance with an input enable signal.

14. A reconfigurable circuit comprising:

a plurality of first lines;

a plurality of first selection transistors respectively connected to the plurality of first lines and controlled by first address;

a plurality of second lines;

a plurality of second selection transistors respectively connected to the plurality of second lines and controlled by second address;

a resistive switch assembly disposed at each of cross-points between the plurality of first lines and the plurality of second lines, the resistive switch assembly including a first non-volatile resistive switch and a second non-volatile resistive switch whose first end is coupled to a first end of the first non-volatile resistive switch;

a first switch element connecting at least one of the first lines to a first power source line of first voltage in response to a memory enable signal;

a second switch element connecting at least one of the second lines to a second power source line of second voltage in response to the memory enable signal, the second voltage being different from the first voltage; and a plurality of third switch elements whose first ends are coupled to the plurality of second lines, respectively, wherein second ends of the third switch elements are used as input ends, and the plurality of first lines are coupled to output ends, respectively, and wherein, in each resistive switch assembly, a second end of the first non-volatile resistive switch is coupled to the first line, and a second end of the second non-volatile resistive switch is coupled to the second line.

* * * * *